(12) United States Patent
Tamura et al.

(10) Patent No.: US 6,717,227 B2
(45) Date of Patent: Apr. 6, 2004

(54) MEMS DEVICES AND METHODS OF MANUFACTURE

(75) Inventors: Hirokazu Tamura, Wellesley, MA (US); Matthew J. Neal, Marlborough, MA (US); Akira Mugino, Newton, MA (US); Alan L. Sidman, Wellesley, MA (US)

(73) Assignees: Advanced Microsensors, Shrewsbury, MA (US); Furukawa America, Inc., Clinton, NJ (US)

( * ) Notice: Subject to any disclaimer, the term of this patent is extended or adjusted under 35 U.S.C. 154(b) by 0 days.

(21) Appl. No.: 10/079,985

(22) Filed: Feb. 21, 2002

(65) Prior Publication Data

US 2003/0156451 A1 Aug. 21, 2003

(51) Int. Cl.[7] .............................................. H01L 29/82
(52) U.S. Cl. ........................ 257/421; 369/119; 257/52; 257/254; 257/415; 257/419
(58) Field of Search ............................ 369/119; 257/52, 257/254, 415, 419

(56) References Cited

U.S. PATENT DOCUMENTS

| | | | |
|---|---|---|---|
| 5,206,983 A | 5/1993 | Guckel et al. ................ 29/598 |
| 5,327,033 A | 7/1994 | Guckel et al. ................ 310/40 |
| 5,629,918 A | 5/1997 | Ho et al. ..................... 369/112 |
| 5,644,177 A | 7/1997 | Guckel et al. ................ 310/40 |
| 5,778,513 A | 7/1998 | Miu et al. ................... 29/602.1 |
| 5,808,384 A | 9/1998 | Tabat et al. ................. 310/40 |
| 5,909,078 A | 6/1999 | Wood et al. ................. 310/307 |
| 5,929,542 A | 7/1999 | Ohnstein et al. ............. 310/40 |
| 5,994,816 A | 11/1999 | Dhuler et al. ................ 310/307 |
| 6,044,056 A * | 3/2000 | Wilde et al. ................ 369/119 |
| 6,085,016 A | 7/2000 | Espindola et al. .......... 385/140 |
| 6,087,743 A | 7/2000 | Guckel et al. ............... 310/40 |
| 6,137,941 A | 10/2000 | Robinson .................... 385/140 |
| 6,163,643 A | 12/2000 | Bergmann et al. .......... 385/140 |
| 6,166,478 A | 12/2000 | Yi et al. ...................... 310/328 |
| 6,171,886 B1 | 1/2001 | Ghosh et al. ................ 438/73 |
| 6,173,105 B1 | 1/2001 | Aksyuk et al. .............. 385/140 |
| 6,222,954 B1 | 4/2001 | Riza ............................ 385/18 |
| 6,246,826 B1 | 6/2001 | O'Keefe et al. ............ 385/140 |
| 6,255,757 B1 | 7/2001 | Dhuler et al. ............... 310/307 |
| 6,262,463 B1 | 7/2001 | Miu et al. ................... 257/414 |
| 6,265,239 B1 | 7/2001 | Aksyuk et al. ............... 438/52 |
| 6,275,320 B1 | 8/2001 | Dhuler et al. ............... 359/237 |
| 6,285,504 B1 | 9/2001 | Diemeer ..................... 359/578 |
| 6,300,619 B1 | 10/2001 | Aksyuk et al. ............. 250/216 |
| 6,308,631 B1 | 10/2001 | Smith et al. ................ 102/254 |
| 6,324,748 B1 | 12/2001 | Dhuler et al. ............... 29/622 |
| 6,327,855 B1 | 12/2001 | Hill et al. .................... 60/528 |

OTHER PUBLICATIONS

Bhansali et al.; "Prototype Feedback–Controlled Bidirectional Actuation System for MEMS Applications", Journal of Microelectromechanical Systems, 9(2): 245–251 (Jun. 2000).

(List continued on next page.)

*Primary Examiner*—David Nelms
*Assistant Examiner*—Mai-Huong Tran
(74) *Attorney, Agent, or Firm*—Foley & Hoag LLP

(57) ABSTRACT

Microelectromechanical (MEMS) devices that use MEMS electromagnetic actuators to selectively generate displacement forces are disclosed herein. According to one exemplary embodiment disclosed herein, a MEMS device may include a substrate having a surface, an actuable element at least partially formed from the substrate, and an electromagnetic actuator disposed on the substrate for selectively applying a first force to the actuable element to displace the actuable element along a path. The actuable element may have a base and an arm coupled to the base. The base may include a portion comprised of a magnetic material. The electromagnetic actuator may comprise an electrically conductive coil, and the path of the actuable element may pass through a coil gap in the coil. The electromagnetic actuator may also comprise a magnetic core about which the electrically conductive coil may be wound.

69 Claims, 31 Drawing Sheets

OTHER PUBLICATIONS

Stephen Cohen, "Novel VOAs Provide More Speed and Utility", Laser Focus World, pp. 139–146 (Nov. 2000).

Christenson and Guckel; "An Electromagnetic Micro Dynamometer", 1995 IEEE MEMS Proceedings, Amsterdam, the Netherlands, pp. 386–391, Jan. 29–Feb. 2, 1995.

Gong and Zhou, "Micromachined Electromagnetic Actuator", Proceedings of the International Symposium on Test & Measurement, ISTM, pp. 23–26 (1999).

Guckel et al, "Laterally Driven Electromagnetic Actuators", Solid–State Sensor and Actuator Workshop, Hilton Head, South Carolina, pp. 49–52 (Jun. 13–16, 1994).

Guckel et al.; "Design and Testing of Planar Magnetic Micromotors Fabricated by Deep X–Ray Lithography and Electroplating", The $7^{th}$ International Conference on Solid-–State Sensors and Actuators, Yokohama, Japan, pp. 76–79, (Jun. 7–10, 1993).

Guckel et al,; "Fabrication and Testing of the Planar Magnetic Micromotor", J. Micromech. Microeng. 1: 135–138, (1991).

Guckel et al.; "Electromagnetic, Spring Constrained Linear Actuator with Large Throw", Actuator '94, pp. 52–55, (Bremen, Germany Jun. 15–17, 1994).

Guckel et al.; "Micromechanics for Actuators Via Deep X–Ray Lithography", SPIE vol. 2194, pp. 2–10.

Guckel et al.; "Processing and Design Considerations for High Force Output– Large Throw Electrostatics, Linear Microactuators", Actuator 94, Bremen, Germany pp. 105–108, (Jun. 15–17, 1994) (Abstract).

H. Guckel and University of Wisconsin, Madison, "Photograph of Actuator," online, retrieved on Feb. 1, 2002 from URL http://mems.engr.wise.edu/images/linear/integrated_coil.jpg.

Guckel et al.; "Micro Electromagnetic Actuators Based on Deep X–Ray Lithography", International Symposium on Microsystems, Intelligent Materials and Robots, Sendai, Japan, Sep. 27–29, (1995) (Abstract).

Miyajima et al.; "A Durable, Shock–Resistant Electromagnetic Optical Scanner with Polyimide–Based Hinges", Journal of Microelectromechanical Systems 10 (3): 418–424, (Sep. 2001).

Ohnstein et al.; "Tunable IR Filters with Integral Electromagnetic Actuators", Solid–State and Actuator Workshop, Hilton Head, South Carolina, pp. 196–199, (Jun. 2–6, 1996).

Sadler et al.; "A Universal Electromagnetic Microactuator Using Magnetic Interconnection Concepts", Journal of Microelectromechanical Systems 9(4): 460–468, (Dec. 2000).

Sadler et.; "A New Electromagnetic Actuator Using Through–Hole Plating of Nickel/Iron Permalloy", Electrochemical Society Proceedings vol. 98(20): 377–388.

Wright et al.; "A Large –Force, Fully–Integrated MEMS Magnetic Actuator", Transducers 97, International Conference on Solid–State Sensors and Actuators, pp. 793–796, (Chicago, Jun. 16–19, 1997).

* cited by examiner

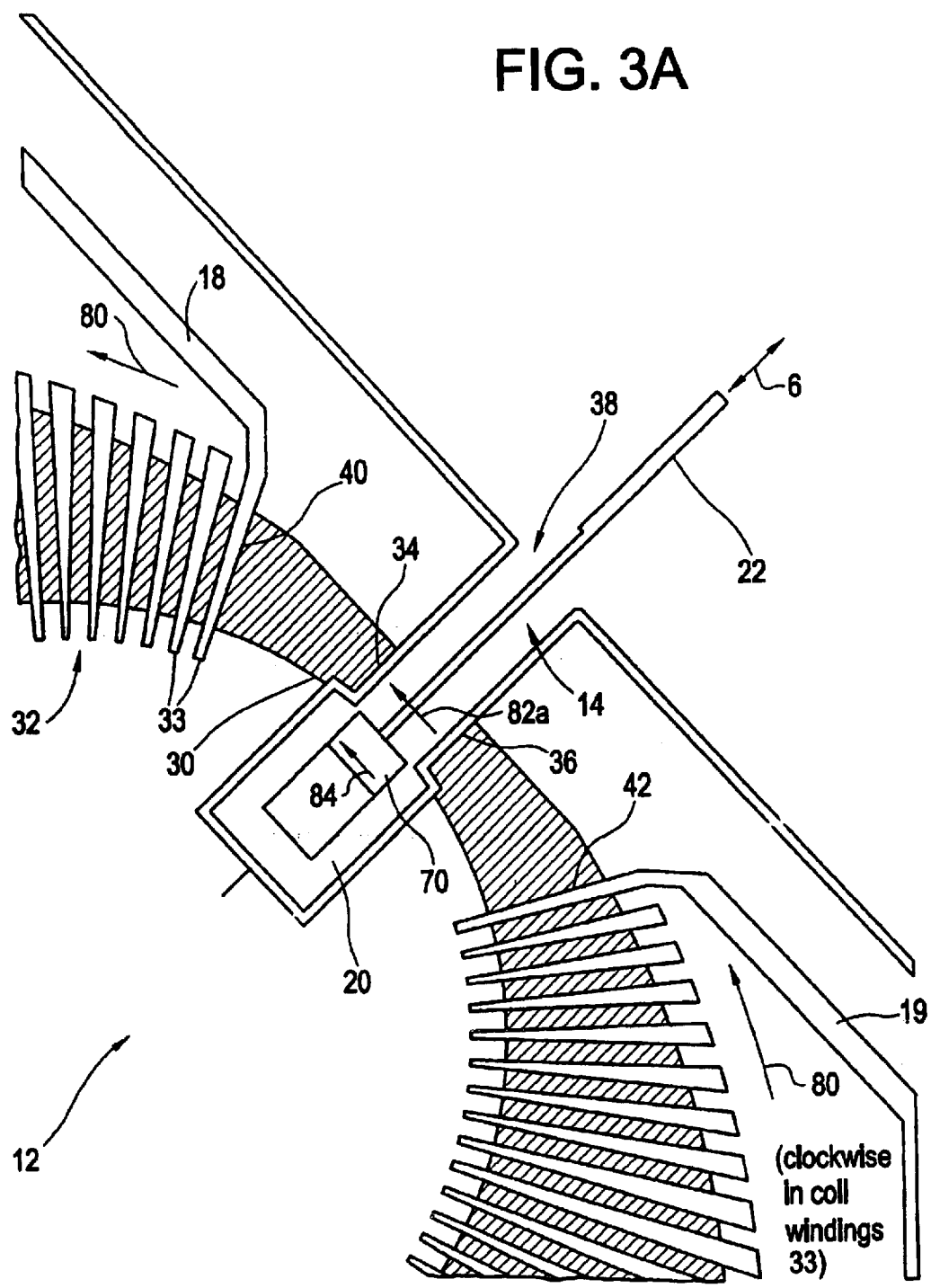

MEMS DEVICES AND METHODS OF MANUFACTURE

BACKGROUND

Advances in semiconductor fabrication technology have enabled the creation of Micro Electro Mechanical (MEMS) devices capable of motion and applying a force at the micron level. MEMS devices having components and features sizes on the micron scale have been fabricated. Such MEMS devices may be employed in a variety of applications including, for example, electrical, fluidic, mechanical, and optical applications, and combinations thereof.

SUMMARY

Disclosed herein are MEMS devices that include electromagnetic and other actuators for selectively generating displacement forces. The MEMS devices disclosed herein may be employed in many applications, including, for example, to generate displacement forces in electrical, fluidic, mechanical, and optical systems, and combinations thereof. In particular, the MEMS devices disclosed herein may be utilized to control electrical, optical, and electro-optical components in an optical fiber based system, such as an optical fiber communication system or an optical fiber computer system.

According to one exemplary embodiment disclosed herein, a MEMS device may include a substrate having a surface, an actuable element at least partially formed from the substrate, and an electromagnetic actuator disposed on the substrate for selectively applying a first force to the actuable element to displace the actuable element along a path. The actuable element may have a base and an arm coupled to the base. The base may include a portion comprised of a magnetic material. The electromagnetic actuator may comprise an electrically conductive coil, and the path of the actuable element may pass through a gap in the coil. The electromagnetic actuator may also comprise a magnetic core about which the electrically conductive coil may be wound.

According to another exemplary embodiment disclosed herein, a MEMS device may include a control mechanism operable to selectively apply a second force to the actuable element in a direction opposite to the first force. The control mechanism may be formed from the substrate. The control mechanism may be coupled to the actuable element at one end and to the substrate at another end. The control mechanism may include one or more stops, one or more clamps, one or more cantilevers, one or more springs, and one or more MEMS actuators.

According to another exemplary embodiment disclosed herein, a MEMS device may include a suspension mechanism for selectively controlling the location of the actuable element in a direction substantially perpendicular to the surface of the substrate. The suspension mechanism may include one or more clamps, one or more springs, or one or more cantilevers. The suspension mechanism may also include one or more permanent magnets or one or more electromagnets.

According to another exemplary embodiment disclosed herein, a MEMS device may comprise a substrate, an actuable element, an actuator disposed on the substrate for selectively applying a first force to the actuable element to displace the actuable element along a path, and at least one cantilever coupled to the actuable element at one end and coupled to the substrate at another end to control displacement of the actuable element along the path.

In one aspect, the actuable element may include an optical element for attenuating an optical beam lying in the path. The optical element may include a shutter for selectively blocking an optical beam. The shutter may include at least one of an opaque, a semi-transparent, a semi-reflective, and a reflective surface.

According to another exemplary embodiment disclosed herein, a method for fabricating a MEMS device on a substrate may include constructing an electromagnetic MEMS actuator on the surface of the substrate by building an electrically conductive coil on the surface of the substrate, the coil being arranged to form a gap between two ends of the coil, and forming an actuable element from a layer of the substrate at a position on the substrate to facilitate displacement of at least a portion of the actuable element relative to the gap upon activation of the electromagnetic MEMS actuator.

In one aspect, a method for fabricating a MEMS device on a substrate may further include constructing a cantilever on the substrate, the cantilever being coupled at one end to the substrate and at another end to the actuable element.

According to another exemplary embodiment disclosed herein, a method of fabricating a magnetically actuable MEMS component from a substrate may include applying and patterning a magnetic layer of the MEMS component on the substrate, applying and patterning a mask layer on the substrate to define a shape of the MEMS component, etching a top layer of the substrate in accordance with the mask to form the MEMS component, and releasing the MEMS component from the substrate to permit displacement of the MEMS component relative to the substrate.

In one aspect, applying and patterning a magnetic layer of the MEMS component on the substrate may comprise applying a layer of magnetic material to a top layer of the substrate, applying a layer of a first material to the layer of magnetic material to form a first mask layer over the layer of magnetic material, applying a layer of a second material to the first mask layer to form a second mask layer, patterning the second mask layer to form a first window through the second mask layer to the first mask layer, patterning the first mask layer through the first window to form a second window through the first layer to the layer of magnetic material, removing the second mask, patterning the layer of magnetic material through the second window to remove magnetic material exposed through the second window, and removing the first mask.

According to another exemplary embodiment, a method of fabricating a MEMS electromagnet on a substrate may include applying a lower layer of electrically conductive material to the substrate, patterning the lower layer to form a lower set of winding elements, applying a second layer of electrically conductive material over the lower set of winding elements, patterning the second layer to form connectors over the winding elements of the lower set of winding elements, and applying a third layer of electrically conductive material over the connectors, and patterning the third layer to form an upper set of winding elements that are electrically connected to the winding elements of the lower set of winding elements by the connectors.

BRIEF DESCRIPTION OF THE DRAWINGS

These and other features of the MEMS devices disclosed herein will be more fully understood by reference to the following detailed description in conjunction with the attached drawings. In the attached drawings, like reference numerals refer to like parts throughout the different views, and reference numerals that differ by increments of 100 refer to similar parts in different embodiments. While the drawings illustrate principles of the MEMS devices disclosed herein, they are not drawn to scale, but show only relative dimensions.

FIG. 3A is a top view of the MEMS actuator shown in FIG. 2A, illustrating a first state of operation.

DETAILED DESCRIPTION OF CERTAIN EXEMPLARY EMBODIMENTS

Figure 1A:
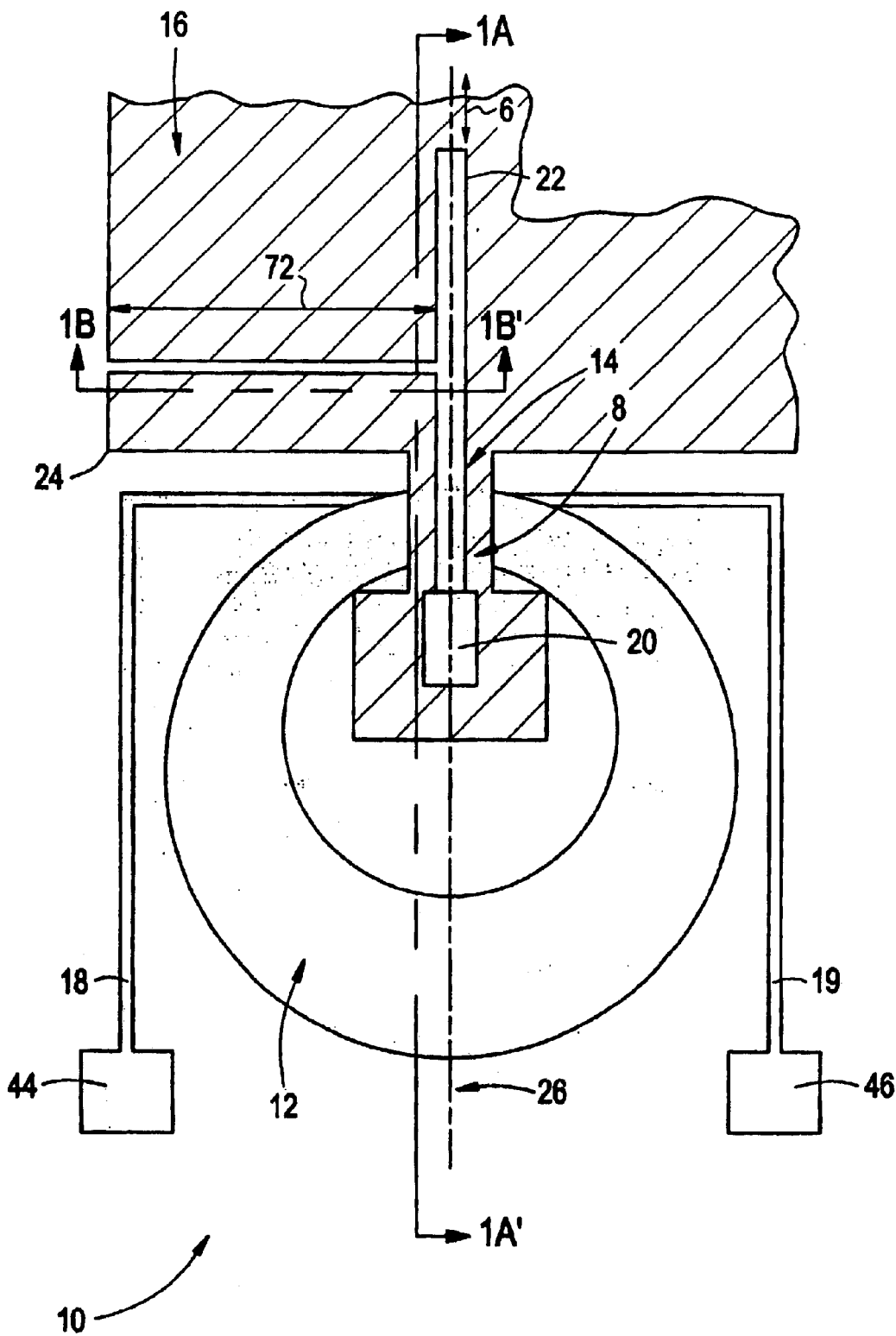
FIG. 1A is a top view of an embodiment of a MEMS device disclosed herein.

Certain exemplary embodiments will now be described to provide an overall understanding of the principles of the MEMS devices and methods of fabrication disclosed herein. One or more examples of these embodiments are illustrated in the drawings. Those of ordinary skill in the art will understand that the MEMS devices and methods of fabrication disclosed herein can be adapted and modified to provide instruments and methods for other applications and that other additions and modifications can be made without departing from the scope of the present disclosure. For example, the features illustrated or described as part of one embodiment or one drawing can be used on another embodiment or another drawing to yield yet another embodiment. Such modifications and variations are intended to be included within the scope of the present disclosure.

Figure 1B:
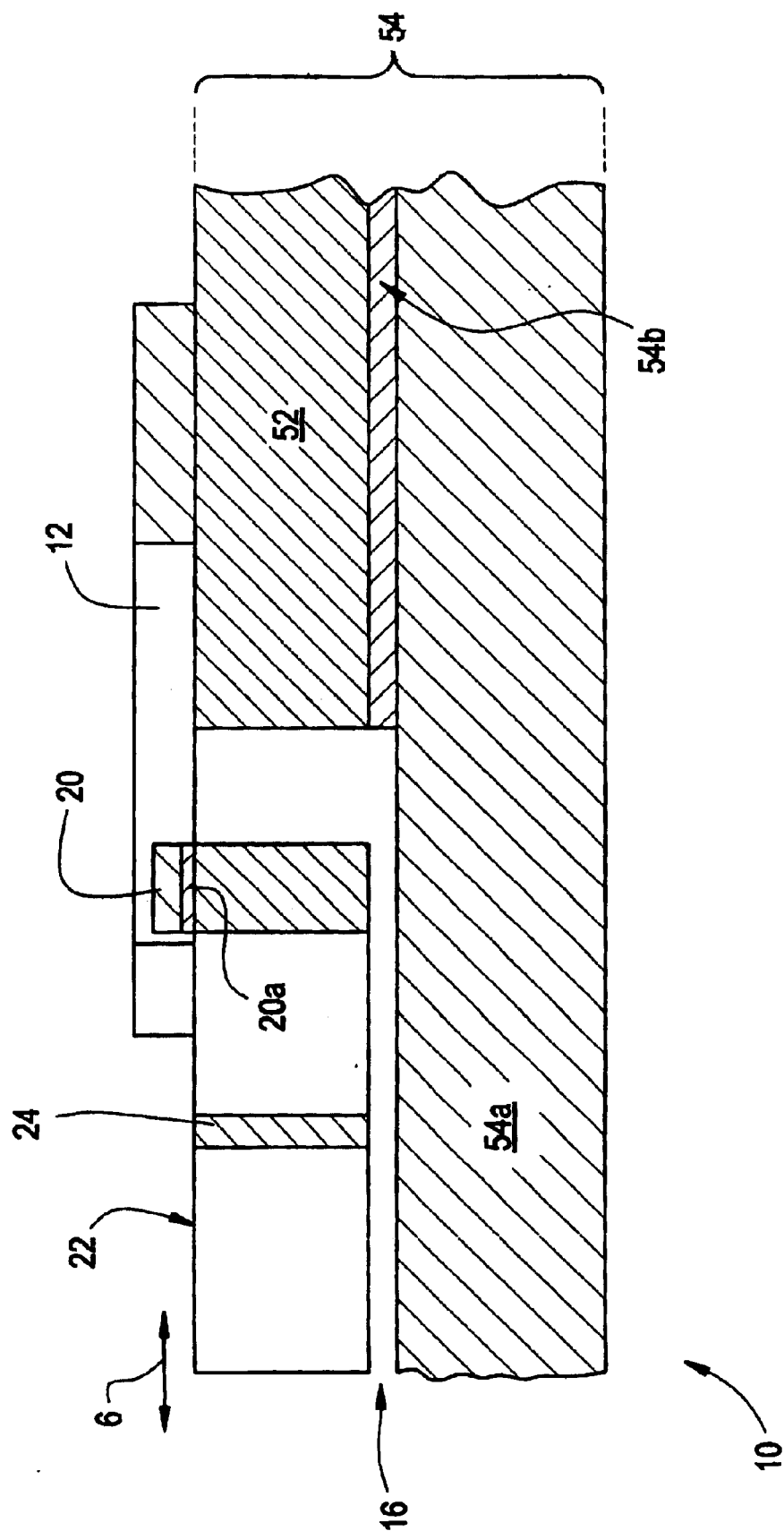
FIG. 1B is a side elevation view of the MEMS device shown in FIG. 1A along the line A–A'.
Figure 1C:
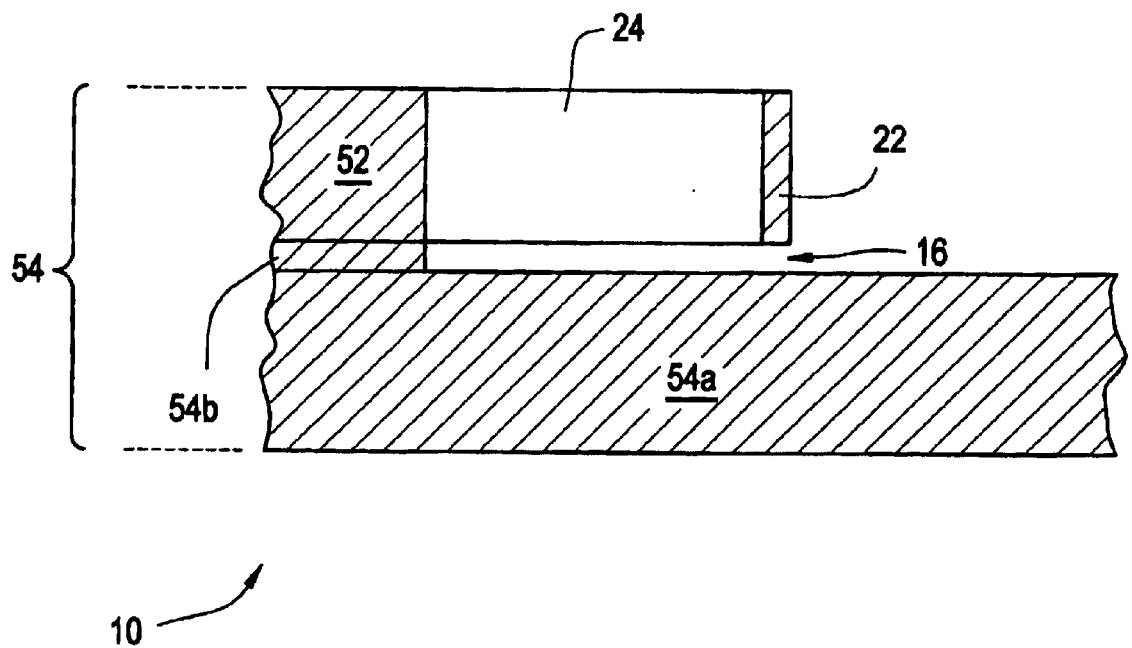
FIG. 1C is a side elevation view of the MEMS device shown in FIG. 1A along the line B–B'.

An exemplary embodiment of a MEMS device disposed on a substrate is shown in FIGS. 1A, 1B, and 1C. The MEMS device 10 includes a MEMS actuator 12 and an actuable element 14. In the exemplary embodiment, the MEMS actuator 12 is an electromagnetic actuator, as shown in FIGS. 2A, 2B, 2C, and 2D and described below. Alternatively, the MEMS actuator may be another type of MEMS actuator such as, for example, an electrostatic, thermal, or piezoelectric actuator. The illustrated MEMS actuator includes an electrically conductive coil arranged to generate a magnetic field with a gap 8 formed by the spaced-apart ends of the actuator 12 upon application of a current to the coil. The MEMS electromagnetic actuator 12 is coupled to a first electrically conducting lead 18 and a second electrically conducting lead 19 that terminate in a first electrode pad 44 and a second electrode pad 46, respectively.

The actuable element 14 is shaped to include a base 20 and an elongated arm 22 coupled to and extending from the base 20. As discussed below, the base 20 or other portion of the actuable element 14 may include a layer or portion of magnetic material. The base 20 of the actuable element 14 may be positioned proximate the gap 8 such that the base 20 can be displaced relative to the gap 8 upon application of a magnetic field on the actuable element 14. Optionally, a cantilever 24 or other mechanism for controlling the displacement of the actuable element may be coupled to the actuable element 14 at one end and to the substrate 54 at another end.

In the exemplary embodiment illustrated in FIGS. 1A, 1B, and 1C, the MEMS actuator 12 is constructed on the surface of the substrate 54 and the actuable element 14 and the cantilever 24 is constructed from the substrate 54, preferably from a top device layer 52 of the substrate 54. In this manner, the actuable element 14 and the cantilever 24 may be suspended over a cavity 16 (denoted by crosshatching in FIG. 1A) in the substrate 54 and are free to be displaced relative to the substrate 52. Using the manufacturing processes described below, all or at least a portion of the components of the MEMS device, e.g., the actuator 12, the actuable element 14 and/or the cantilever 24 (or other control mechanism), may be constructed from one or more layers of the substrate 54 to reduce the extent of the MEMS device 10 in a direction perpendicular from the substrate surface. Alternatively, all or portions of the components of the MEMS device 10 may be constructed on the surface of the substrate 54 through deposition processes or other additive processes.

The MEMS device 10 provides precise electronic control of the position of the actuable element 14. Operation of the MEMS device 10 can be understood in the following manner. An external power source (not shown) provides an operating current to the first and second electrode pads 44, 46. The first and second electrode pads 44, 46 communicate the operating current to the actuator 12 through the first and second leads 18, 19, respectively. After receiving an operating current, the actuator 12 may selectively apply a first force to the actuable element 14. The first force tends to displace the actuable element 14 relative to the gap 8 along a path 6 that is substantially parallel to the axis of actuation 26. The cantilever 24 selectively applies a second force to the actuable element 14. Like the first force, the second force also acts along the axis of actuation 26. Unlike the first force, however, the second force acts in an opposite direction, and tends to restore the actuable element 14 to its original position on the path 6 and limit the displacement of actuable element 14 along the path 6. To effect displacement of the actuable element 14, an operating current is applied to the MEMS actuator 12 to generate a first force that has a magnitude greater than that of the second force. Upon removal of the operating current, the second force restores the actuable element 14 to its original position on the path 6. By varying the operating current to the MEMS actuator 12, the MEMS device 10 provides precise electronic control of the displacement of the actuable element 14 along the path 6.

As shown in FIGS. 1A, 1B, and 1C, each of the path 6, the actuator 12, and the actuable element 14 lies in a plane that is substantially parallel to the substantially planar surface of the substrate 54. Alternately, any combination of the path 6, the actuator 12, and the actuable element 14 may lie in a plane that is inclined at an angle to the substantially planar surface of the substrate 54. Also alternately, the path 6 may include constituent portions that are not coplanar with each other, the actuator 12 may include constituent portions that are not coplanar with each other, and the actuable element 14 may include constituent portions that are not coplanar with each other. Additionally, the path 6, the actuator 12, and the actuable element 14 may not be coplanar with each other.

An exemplary embodiment of the actuator 12 is shown in FIGS. 2A, 2B, 2C, and 2D. The actuator 12 includes a magnetic core 30 and an electrically conductive coil 32 wrapped around the core 30 in a manner analogous to a solenoid or a toroid. Alternatively, the actuator 12 may include an electrically conductive coil 32 without a magnetic core 30. Preferably, however, the actuator 12 includes a magnetic core 32 to enhance the strength of the magnetic field generated at the core gap 38 for a given operating current applied to the actuator 12. Preferably, the actuator 12 is substantially planar, and lies in a plane that is substantially parallel to the substantially planar surface of the substrate.

As shown in FIGS. 2A, 2B, 2C, and 2D, the core 30 has a substantially circular shape when viewed from above and a substantially rectangular cross-section that has an extent that is substantially constant across the circumference of the core 30. Alternately, the core 30 may have a variety of shapes when viewed from above and a variety of cross-section shapes. For example, these shapes may include the shape of any type of oval, including an ellipse and a circle, any type of polygon, including a rectangle, a square, and a triangle, and the shape of any type of semi-oval, including a semi-circle. Also alternately, the cross-section may have an extent that varies across the circumference of the core 30.

The core 30 is constructed from magnetic material. The core may be constructed from a material having a magnetic permeability of at least $4 \times 10^3$. Preferably, the magnetic permeability of the core material is between approximately $8 \times 10^3$ and approximately $1 \times 10^6$. Preferably, the core is constructed from a soft magnetic material, including, but not limited to, NiFe (permalloy), CoFe (permendur), CoZr, FeN, AlSiFe (sendust) and alloys thereof, such as NiFeMo (supermalloy), NiFeCuCr (mumetal), NiFeCo, CoFeB, CoFeV (supermendur), CoFeCr (hiperco), CoZrTa, FeAlN, and FeTaN.

Figure 2A:
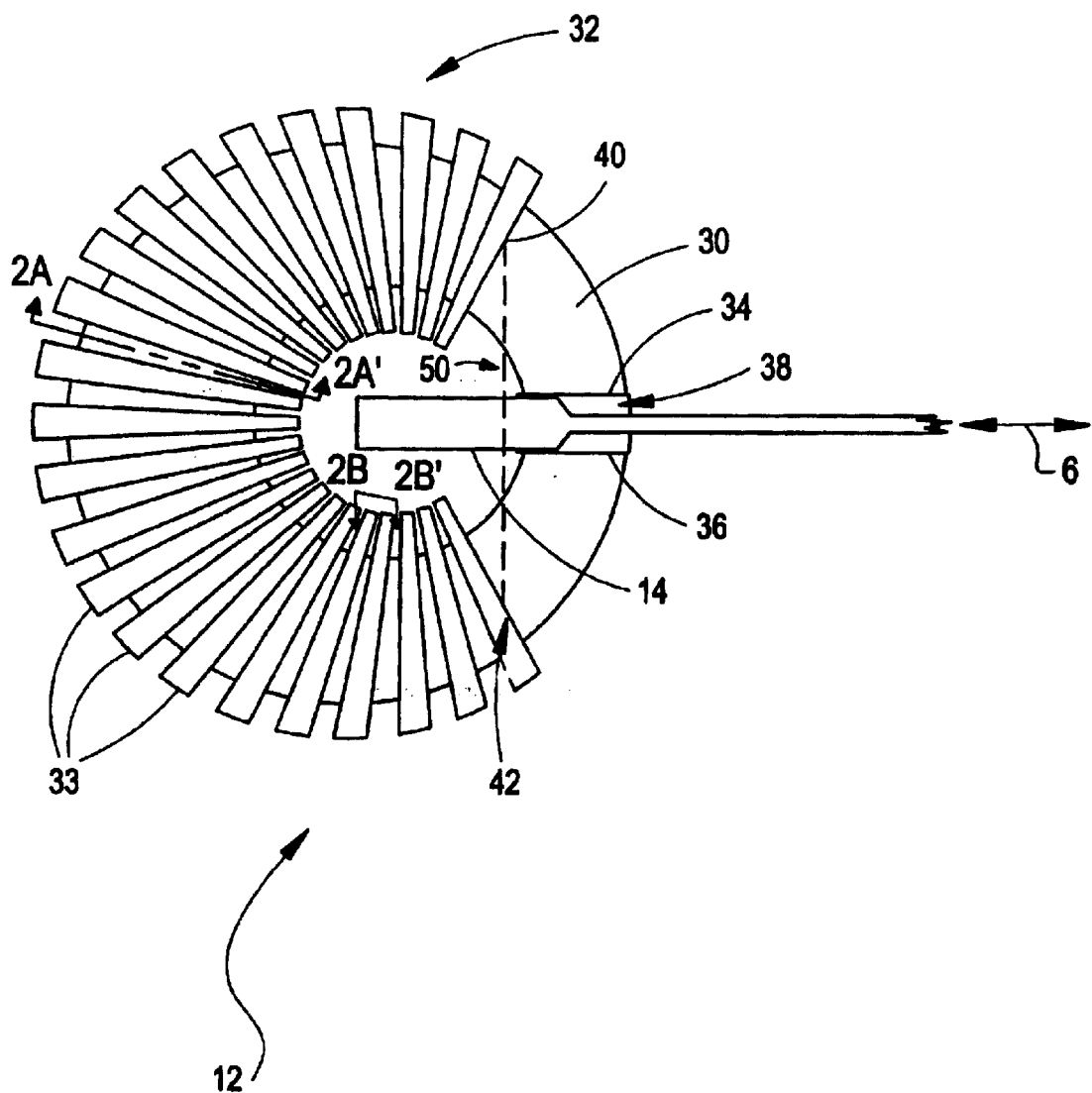
FIG. 2A is a top view of an embodiment of a MEMS actuator disclosed herein.
Figure 2B:
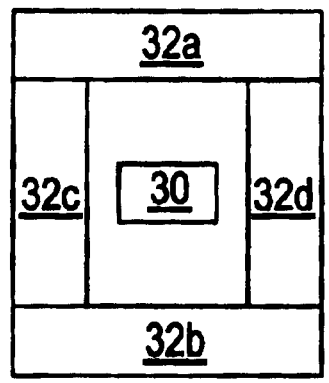
FIG. 2B is a side elevation view of the MEMS actuator shown in FIG. 2A along the line A–A'.
Figure 2C:
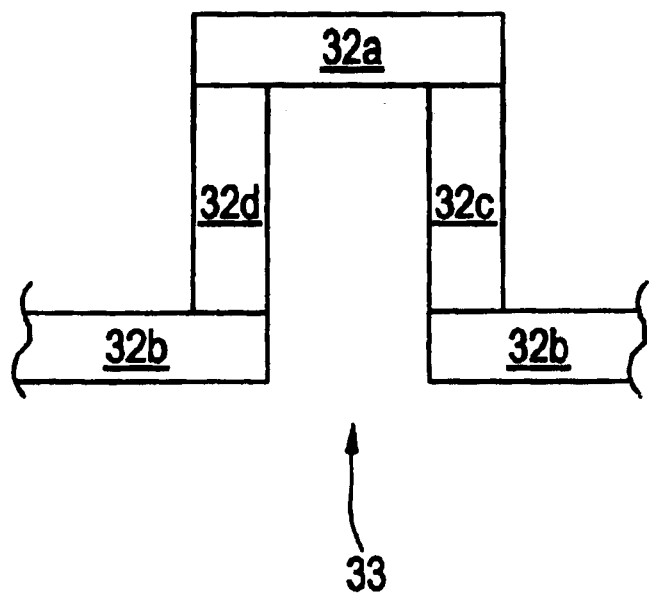
FIG. 2C is a side elevation view of the MEMS actuator shown in FIG. 2A along the line B–B'.
Figure 2D:
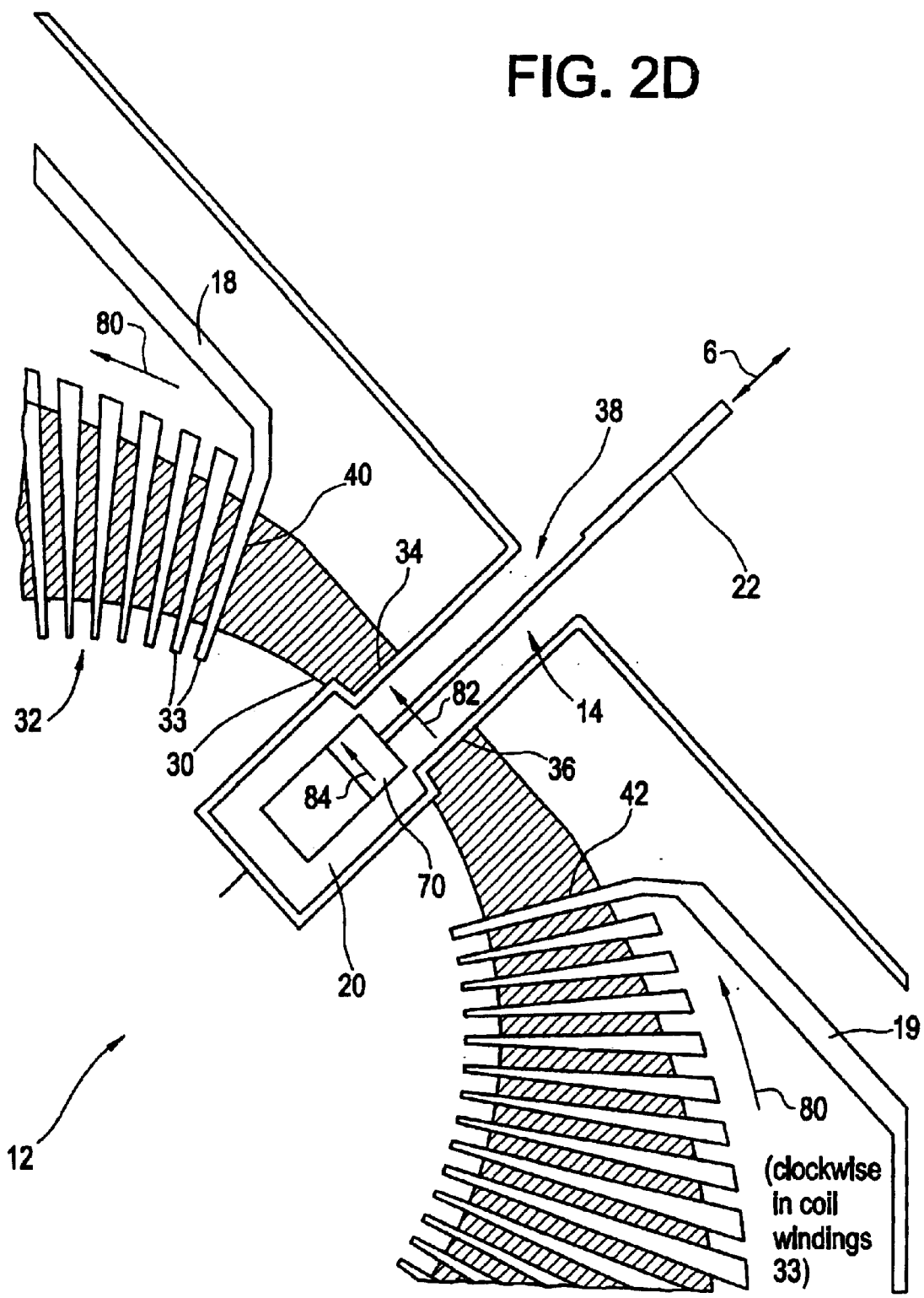
FIG. 2D is a partial top view of the MEMS actuator shown in FIG. 2A, enlarged to show detail.

As shown in FIGS. 2A and 2D, the core 30 has a first core end 34 and a second core end 36 separated from each other by a core gap 38. The core gap 38 has a size and shape that permits the actuable element 14 to be displaced therethrough. The size and shape of the core gap 38 depend on a variety of core parameters including the core shape and the core composition. The size and shape of the core gap 38 also depend upon the limitations of the fabrication process. Preferably, the core gap 38 has an extent in a direction substantially perpendicular to the path of at least approximately 5 $\mu$m.

As shown in FIGS. 2A and 2D, the electrically conductive coil 32 has a number of coil windings 33, a first coil end 40 located near the first core end 34, and a second coil end 42 located near the second core end 36. As shown in FIGS. 2B and 2C and explained in greater detail below, each winding 33 of the coil 32 includes an upper winding element 32a, a lower winding element 32b, a first connector 32c, and a second connector 32d. As shown in FIG. 2D, the first coil end 40 is connected to first lead 18 (which terminates in first electrode pad 44 as shown in FIG. 1A), and the second coil end 42 is connected to second lead 19 (which terminates in second electrode pad 46 as shown in FIG. 1A). The first and second electrode pads 44, 46 are connected to a source of external power (not shown) for providing an operating current to the actuator 12. The source of external power may be an analog DC power source, which may be used to provide fine control of the position of the actuable element 14. The source of external power may also include any other source of external power known by one of ordinary skill in the art to be suitable for a MEMS device.

As shown in FIG. 2A, the first coil end 40 is separated from the second coil end 42 by a coil gap 50. The coil gap 50 may have an extent that is greater than an extent of the core gap 38. Alternately, the coil gap 50 may have an extent that is at least equal to an extent of the core gap 38.

In the actuator 12, the gap 8 through which the actuable element 14 can be displaced may be defined by the core gap 38 and/or the coil gap 50. In the embodiments illustrated in FIGS. 2A–2D, the gap 8 in the actuator 12 is defined by core gap 38.

As shown in FIGS. 2A, 2B, 2C, and 2D, the coil 32 has a substantially circular shape when viewed from above and a substantially rectangular cross-section that has an extent that is substantially constant across the circumference of the coil 32. Alternately, the coil 32 may have a variety of shapes when viewed from above and a variety of cross-section shapes, provided that the shapes of the coil 32 are compatible with the shapes of the core 30. For example, these shapes may include the shape of any type of oval, including an ellipse and a circle, any type of polygon, including a rectangle, a square, and a triangle, and the shape of any type of semi-oval, including a semi-circle. Also alternately, the cross-section may have an extent that varies across the circumference of the coil 32. The coil 32 may have an inductance of at least approximately 50 nH, and preferably between approximately 100 nH and approximately 1 MH.

The coil 32 is constructed from an electrically conductive material. Preferably, the coil 32 is constructed from an electrically conductive material having a resistivity of less than approximately $1 \times 10^{-7}$ Ωm at 20° C. Preferably, the coil 32 is constructed from copper or an alloy thereof. Alternately, the coil 32 may be constructed from aluminum, gold, silver, and alloys thereof.

The physical dimensions of the core 30 and the coil 32 depend on a variety of parameters. Generally, the shape of the core 30 may be optimized by finite-element modeling to reduce saturation and flux leakage. The number of windings 33 in the coil 32, the width of the core gap 38, and the cross-sectional areas of the first and second core ends 34, 36 can be varied to adjust the strength of the magnetic field generated at the core gap 38. The coil 32 may have at least ten windings 33, and preferably greater than fifty windings 33.

An exemplary embodiment of the actuable element 14 is shown in FIG. 2D. In the illustrated exemplary embodiment, the base 20 of the actuable element 14 includes a front portion 70 constructed from a magnetic material. The front portion 70 is positioned to provide an interface between the base 20 and the arm 22. The front portion 70 may, however, be positioned elsewhere on the base 20. Additionally, the entire base 20 may be constructed from magnetic material, rather than just the front portion 70. The front portion 70 may be constructed from a permanent magnetic material, including, but not limited to, ferrites, remalloy, vicalloy, AlNiCo, Co, CoPt, a rare earth metal, and combinations thereof. In this embodiment, the actuable element 14 has a permanent magnetic dipole moment illustrated by arrow 84. The front portion 70 may also be comprised of a soft magnetic material, including, but not limited to, NiFe (permalloy), CoFe (permendur), CoZr, FeN, AlSiFe (sendust) and alloys thereof, such as NiFeMo (supermalloy), NiFeCuCr (mumetal), NiFeCo, CoFeB, CoFeV (supermendur), CoFeCr (hiperco), CoZrTa, FeAlN, and FeTaN. In the case of soft magnetic materials, the actuable element 14 does not have a permanent magnetic dipole moment.

Displacement of the actuable element 14 along the path 6 through the core gap 38 depends, at least in part, upon the relationship between the magnetic field generated in the core gap 38 by the actuator 12 and the magnetic dipole properties of the front portion 70. An exemplary mode of operation of the MEMS device 10 may be understood in the following manner. Referring to FIGS. 1A, 2A, and 2D, an external power source (not shown) provides an operating current between the first and second coil ends 40, 42 via the first and second leads 18, 19 and the first and second electrode pads 44, 46. The current 80 passing through the coil 32 generates a magnetic field 82 at the core gap 38. Depending on the relationship between the magnetic field 82 and the magnetic dipole properties of the front portion 70, the actuable element 14 may experience an attractive or repulsive force that tends to pull or push the actuable element 14 along the path 6 towards or away from the core gap 38, respectively.

Figure 3B:
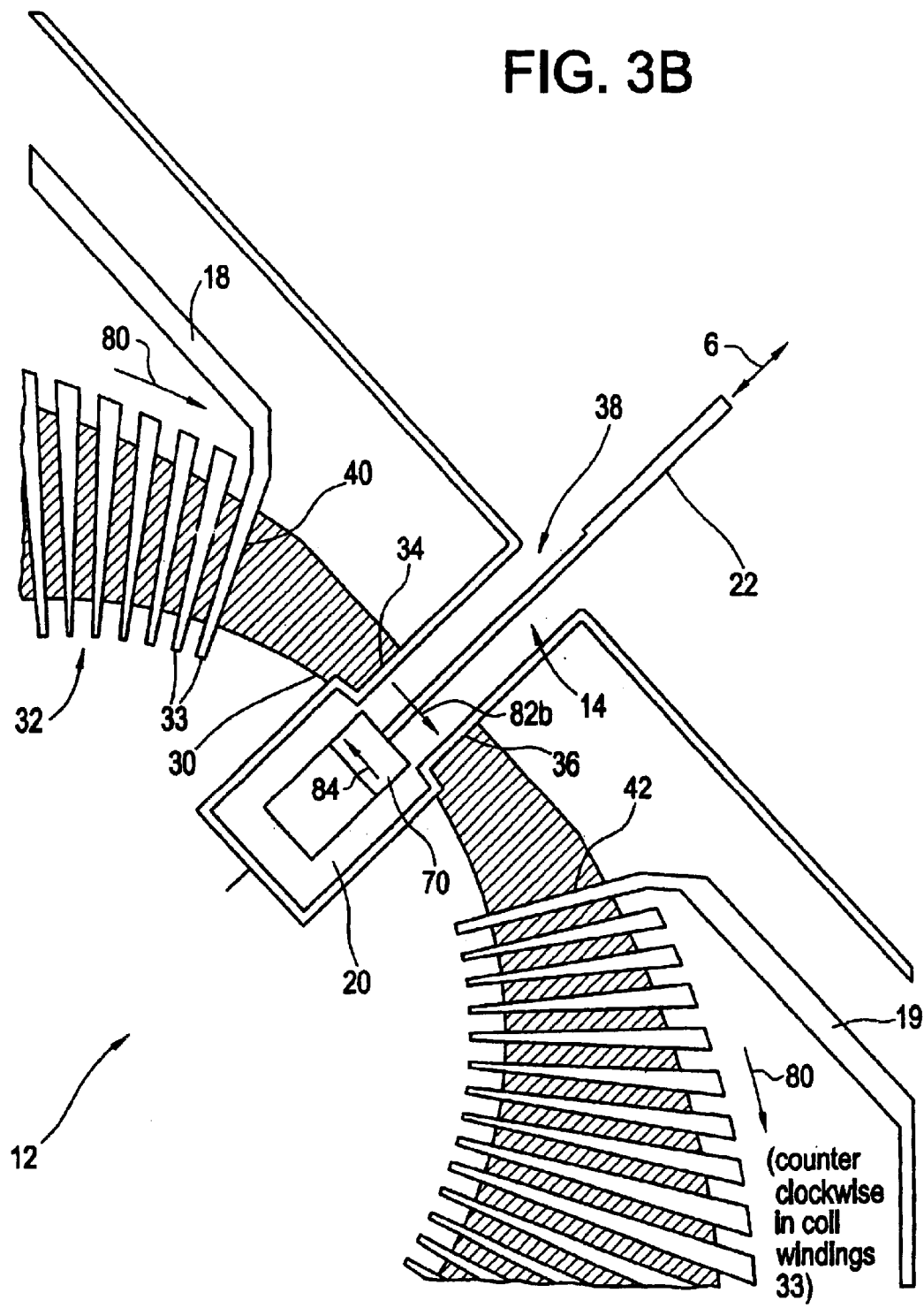
FIG. 3B is a top view of the MEMS actuator shown in FIG. 2A, illustrating a second state of operation.

The displacement of an actuable element 14 in which the front portion 70 has a permanent magnetic dipole moment 84 can be controlled by controlling the direction of the magnetic field 82 in the core gap 38. The operating principles of controlling the direction of the magnetic field 82 in the core gap 38 are shown in FIGS. 3A and 3B. The current may have a first state and a second state, as indicated by arrow 80 in FIGS. 3A and 3B. As shown in FIG. 3A, in the first state, current 80 passes clockwise through the coil 32 from the first coil end 40 to the second coil end 42. Passing current 80 through the coil 32 in the first state generates a magnetic field 82 having a first direction 82a that is substantially parallel to the direction of the magnetic moment 84 in the front portion 70. As a result, in the first state, the actuable element 14 experiences an attractive electromagnetic force tending to pull the actuable element toward the core gap 38. As shown in FIG. 3B, in the second state, current 80 passes counterclockwise through the coil 32 from the second coil end 42 to the first coil end 40. Passing current 80 through the coil 32 in the second state generates a magnetic field 82 having a second direction 82b that is opposite to the first direction 82a and that is also substantially antiparallel to the direction of the magnetic moment 84 in the front portion 70. As a result, in the second state, the actuable element 14 experiences a repulsive electromagnetic force tending to push the actuable element 14 away from the core gap 38.

Based on the foregoing principles, displacement of the actuable element 14 having a front portion 70 with a permanent magnetic dipole moment 84 may be controlled in accordance with the following procedure. First, current 80 may be applied in the first state to the actuator 12. Second, current 80 may be maintained in the first state until the actuable element 14 is displaced to a desired position on the path 6. Third, current 80 may be removed from the first state, and current 80 may be applied in the second state to restore the actuable element 14 to its original position on the path 6. Accordingly, displacement of an actuable element 14 having a portion 70 with a permanent magnetic dipole moment 84 may be precisely controlled without any of the optional control mechanisms, including a clamp, a cantilever, a spring, a suspension system, or a second MEMS actuator, described below.

This procedure does not require that the front portion 70 have a permanent magnetic dipole moment 84 aligned or antialigned with the magnetic field 82 in the core gap 38. Rather, this procedure minimally requires a permanent magnetic dipole moment 84 having a component that lies substantially along the direction of the magnetic field 82 and that is sufficient in magnitude to generate a useful electromagnetic force for displacing the actuable element 14.

As provided previously herein, a front portion 70 comprised of soft magnetic material does not have a permanent magnetic dipole moment 84. As a result, passing current through the coil 32 in both the first and second states tends to produce an attractive force, rather than an attractive force in the first state and a repulsive force in the second state. Displacement of a front portion 70 comprised of soft magnetic material thus tends to require additional control mechanisms. A variety of suitable control mechanisms are provided below.

As suggested in FIGS. 1A, 2A, and 2D, the front portion 70 may have a variety of shapes. Preferably, the front portion 70 has a shape and a material composition that tends to generate a desired relationship between the displacement of the actuable element 14 and the current 80 passing through the coil 32. This relationship may be linear or non-linear depending on the desired application of the MEMS device 10. A front portion 70 constructed from a permanent magnetic tends to generate an approximately linear relationship, and a portion 70 constructed from a soft magnetic material tends to generate a non-linear relationship.

Figure 4A:
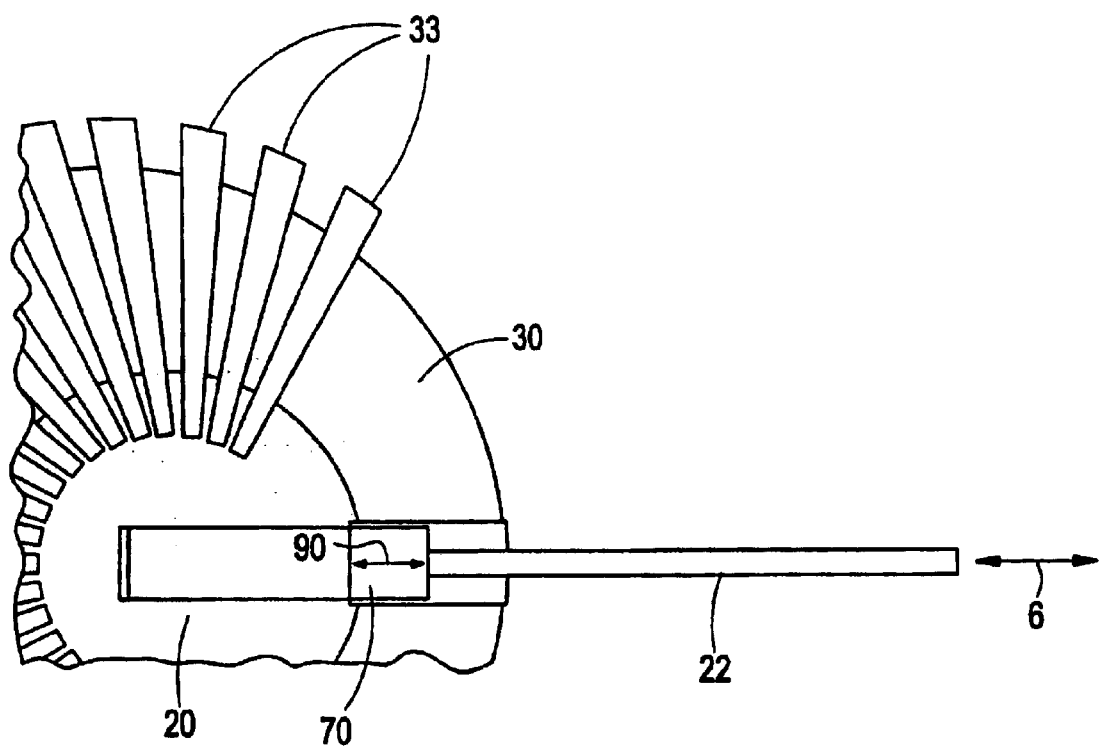
FIG. 4A is a partial top view of the MEMS actuator shown in FIG. 2A, enlarged to show an exemplary embodiment of the MEMS actuable element disclosed herein.
Figure 4A:

An exemplary preferred shape of a front portion 70 comprised of a permanent magnetic material for generating an approximately linear relationship is shown in FIG. 4A. The front portion 70 may have a length 90 in a direction substantially parallel to the path 6 and a cross-section that has an extent that is substantially constant along the length 90. A front portion 70 constructed from a permanent magnetic material and having this shape tends to generate an approximately linear relationship between displacement and current 80. Increasing the length 90 of magnetic material in the front portion 70 may result in a more exactly linear relationship between displacement and current 80.

Figure 4B:
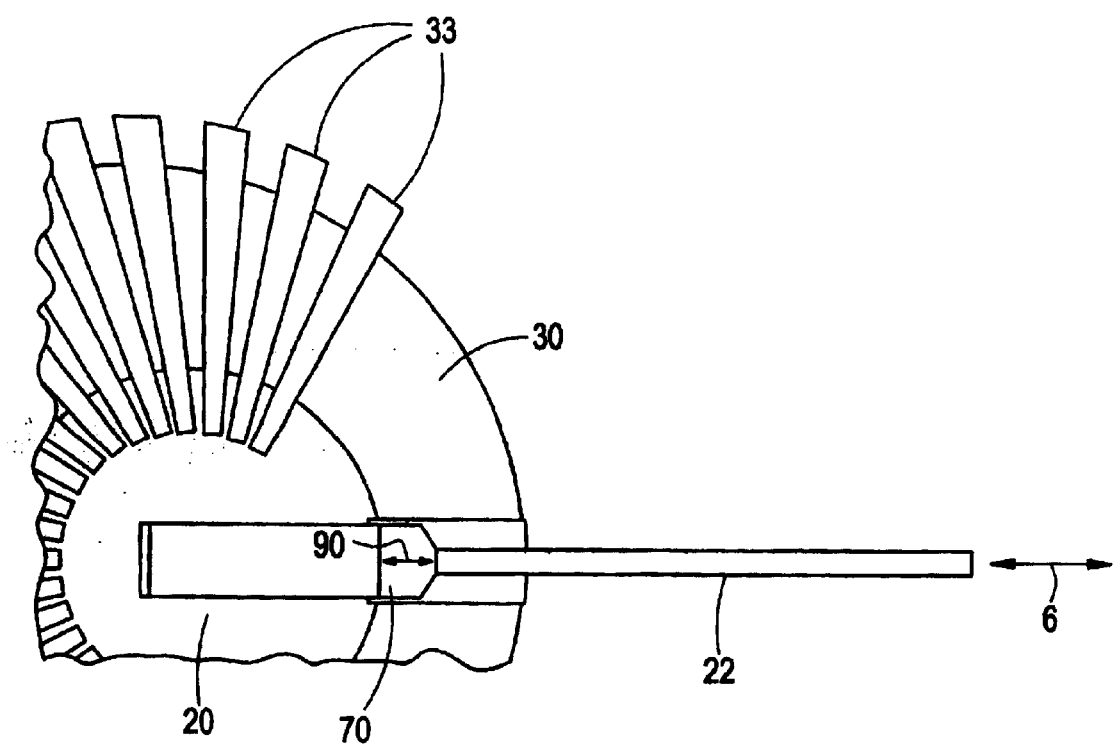
FIG. 4B is a partial top view of the MEMS actuator shown in FIG. 2A, enlarged to show another exemplary embodiment of the MEMS actuable element disclosed herein.

An exemplary shape of a front portion 70 comprised of a permanent magnetic material for generating a non-linear relationship is shown in FIG. 4B. The front portion 70 may have a length 90 in a direction substantially parallel to the path 6 and a cross-section that has an extent that varies along the length 90. A front portion 70 constructed from a permanent magnetic material and having this tapered shape tends to generate a non-linear relationship between displacement and current 80. A front portion 70 constructed from a soft magnetic material may be preferred, however, for generating a non-linear relationship.

A variety of control mechanisms are available for controlling the displacement of the actuable element 14 along the path 6 by restoring the actuable element 14 to a starting position, limiting the displacement of the actuable element 14 along the path, and/or inhibiting deviation of the actuable element 14 in one or more directions from the path 6. One or more of the exemplary control mechanisms may be used with an actuable element 14 that includes a front portion 70 comprised of a permanent magnetic material and also with an actuable element 14 that includes a front portion 70 comprised of a soft magnetic material. Displacement of the actuable element 14 may be controlled by providing a stop, a clamp, a cantilever, a spring, a second MEMS actuator, and any combination of the foregoing items. The control mechanism may be substantially planar, and may be disposed in a plane that is substantially parallel to the substantially planar surface of the substrate 54. Alternately, the control mechanism may be disposed in a plane inclined at an angle to the substantially planar surface of the substrate 54. Also alternately, the control mechanism may include constituent portions that are not coplanar with each other.

The control mechanisms may control the location of the actuable element 14 in a direction substantially perpendicular to the substantially planar surface of the substrate 54. Suitable control mechanisms for limiting displacement from the surface of the substrate 54 include a clamp, a cantilever, a spring, a suspension system, and any combination of the foregoing items. Each of these mechanisms may be substantially planar, and each of these mechanisms may be disposed in a plane that is substantially parallel to the substantially planar surface of the substrate 54. Alternately, each of these mechanisms may be disposed in a plane inclined at an angle to the substantially planar surface of the substrate 54. Also alternately, each of these mechanisms may include constituent portions that are not coplanar with each other.

Figure 5:
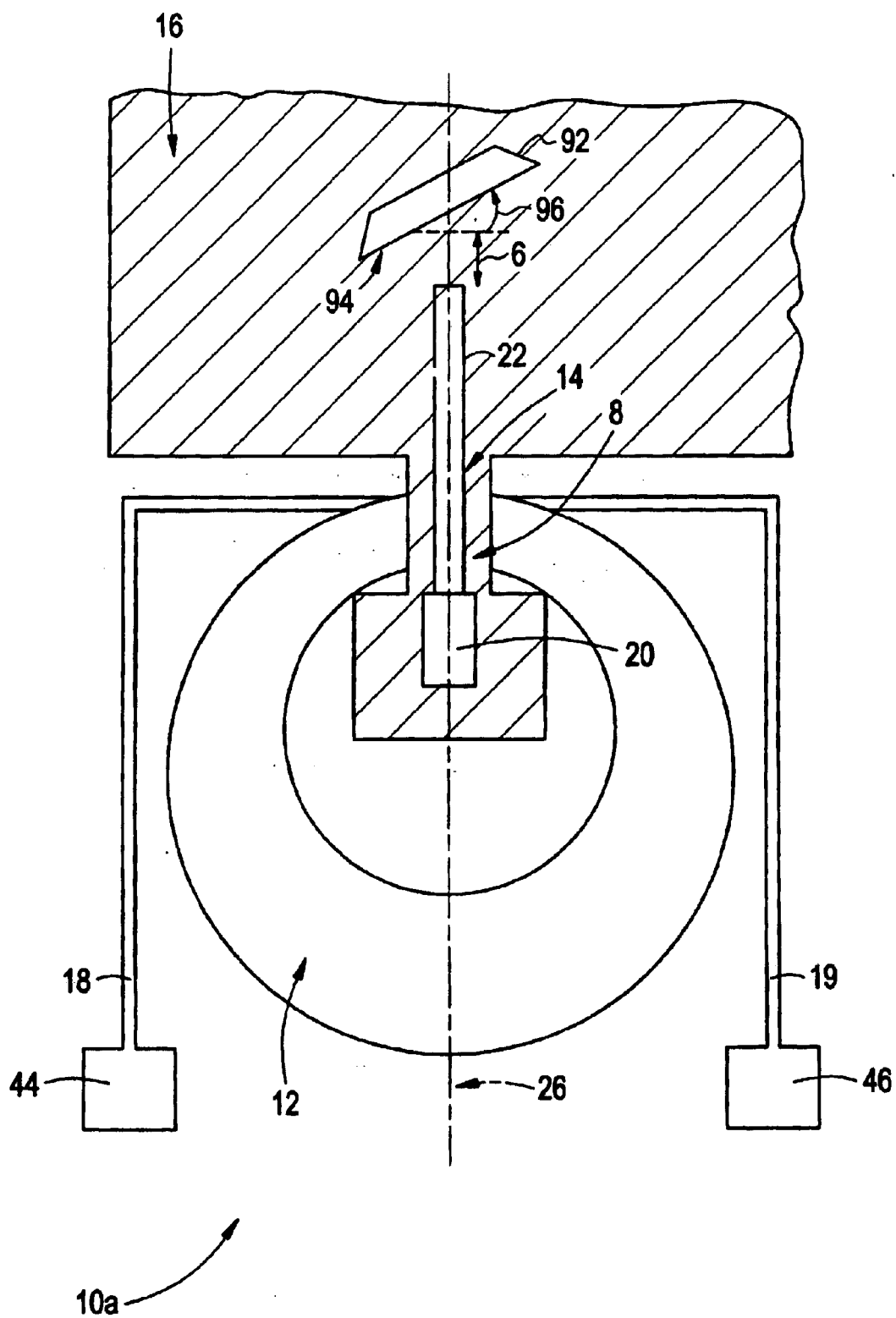
FIG. 5 is a top view of the MEMS device shown in FIG. 1A, illustrating an embodiment of a stop disposed in the path of an actuable element.

An exemplary embodiment of a control mechanism in the form of a stop is shown in FIG. 5. The MEMS device 10a includes a stop 92 in the form of a wall disposed on the substrate 54 to selectively inhibit displacement of the actuable element 14 beyond a desired position on the path 6. The MEMS device 10a also includes a suitable secondary control mechanism (not shown) for controlling the location of the actuable element 14 in the direction substantially perpendicular to the substantially planar surface of the substrate. The secondary control mechanism may be a clamp, a cantilever, a spring, or a suspension system, as described below. The stop 92 may intersect the path 6 and the axis of actuation 26 and have a surface 94 that is oriented at an angle 96 to the direction of the path 6. In this embodiment, the stop 92 may inhibit displacement of the actuable element 14 by providing a rigid barrier to further displacement and may also deflect the actuable element 14 onto another path. For this latter purpose, the surface 94 of the stop 92 may be at least partially comprised of or coated with a resilient material for deflecting the actuable element 14. Additionally, the surface 94 may be at least partially comprised of or coated with a wear-protective material for protecting the surface 94 from being deformed or otherwise altered by contact with the actuable element 14. The stop 92 may have a surface 94 oriented at any angle 96 with respect to the path 6. For example, the stop 92 may have a surface 94 oriented at a substantially perpendicular angle to the path 6.

Figure 6:
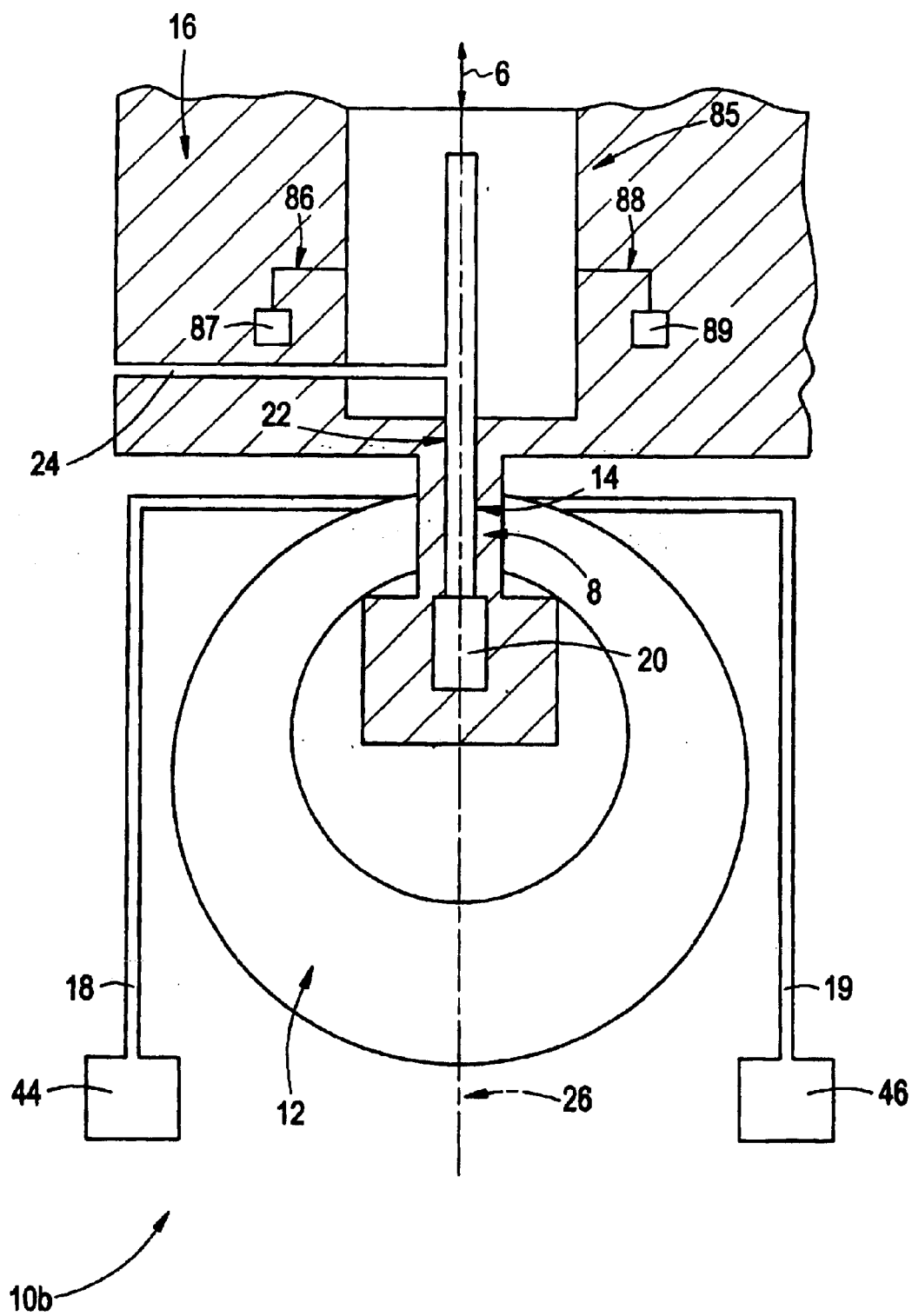
FIG. 6 is a top view of the MEMS device shown in FIG. 1A, illustrating an embodiment of a clamp.

An exemplary embodiment of a control mechanism in the form of a clamp is shown in FIG. 6. A variety of clamps may be utilized in the MEMS device 10b. For example, the MEMS device 10b may include, but is not limited to, a mechanical clamp, an electrostatic clamp, and an electromagnetic clamp. An exemplary electromagnetic clamp is shown in FIG. 6. The MEMS device 10b includes an electromagnetic clamp 85 that may be disposed on the substrate 54 for selectively clamping the actuable element 14 at a desired position on the path 6. The clamp 85 may reduce the amount of power consumed by the MEMS actuator 12, thereby possibly increasing the useful life of the MEMS actuator 12. Operation of the clamp 85 may be understood in the following manner. First, the actuable element 14 may be displaced to a desired position by energizing the actuator 12. Second, the clamp 85 may be energized to maintain the displacement of the actuable element 14 at a desired location, and the actuator 12 may be de-energized. The clamp 85 may include first and second leads 86, 88 and first and second electrode pads 87, 89 for connection to an external power source (not shown). The clamp 85 may be coupled to the actuator 12, the actuable element 14, or both. The clamp 85 may be constructed in a manner analogous to the that for the electromagnetic actuator described below.

An exemplary embodiment of a cantilever control mechanism is shown in FIGS. 1A, 1B, and 1C. A cantilever 24 may be suspended within the cavity 16 formed in the substrate 54 and coupled at one end to the arm 22 of the actuable element 14 and at another end to the substrate 54 for selectively applying a second force to the actuable element 14 in a direction opposite to the first force applied by the actuator 12. As provided previously herein, this second force tends to restore the actuable element 14 to its original position on the path 6. The magnitude of the second force selectively applied by the cantilever 24 depends on a variety of factors, including the physical dimensions of the cantilever 24 and the Young's modulus of the material from which the cantilever 24 is constructed.

In certain embodiments, the cantilever 24 may be constructed directly from the substrate material. For example, as shown in FIGS. 1B and 1C and explained in greater detail below, the substrate 54 may include a base layer 54a and a buried oxide layer 54b formed thereon. A device layer 52 of single crystal Si may be formed on the buried oxide layer 54b. The cantilever 24 in one exemplary embodiment may be constructed from the single crystal Si device layer 52 of the substrate 54 and may be suspended above the base layer 54a of the substrate 54. The cantilever 24 may be fabricated by a release etching process or other process as described in detail below. Fabricating the cantilever 24 from the substrate material, i.e., the single crystal Si device layer of the present example, may generate a durable and robust control mechanism suitable for mass production. The desired degree of elasticity of the cantilever 24 can be selected for the particular application of the MEMS device. For example, in certain applications, a rigid cantilever 24 may be desirable, while in other applications, a softer cantilever may be preferable. Generally, the Young's modulus of the cantilever 24 depends on the crystal orientation of the Si device layer 52. As such, a cantilever 24 having a desired degree of elasticity can be fabricated by selecting a Si device layer 52 that has an appropriate crystal orientation. Exemplary crystal orientations in a plane substantially perpendicular to the base layer 54a include, in conventional notation, <111>, <110>, and <100>.

As shown in FIGS. 1A, 1B, and 1C, the cantilever 24 has a substantially rectangular shape when viewed from above and a substantially rectangular cross-section that has an extent that is substantially constant across a length 72 of the cantilever. Alternately, the cantilever 24 may have a variety of shapes when viewed from above and a variety of cross-section shapes, provided that the shapes of the cantilever 24 are suitable for selectively applying a control force to the actuable element 14. For example, these shapes may include the shape of any type of oval, including an ellipse and a circle, any type of polygon, including a rectangle, a square, and a triangle, and the shape of any type of semi-oval, including a semi-circle. Also alternately, the cross-section may have an extent that varies across the length of the cantilever 24.

Figure 7A:
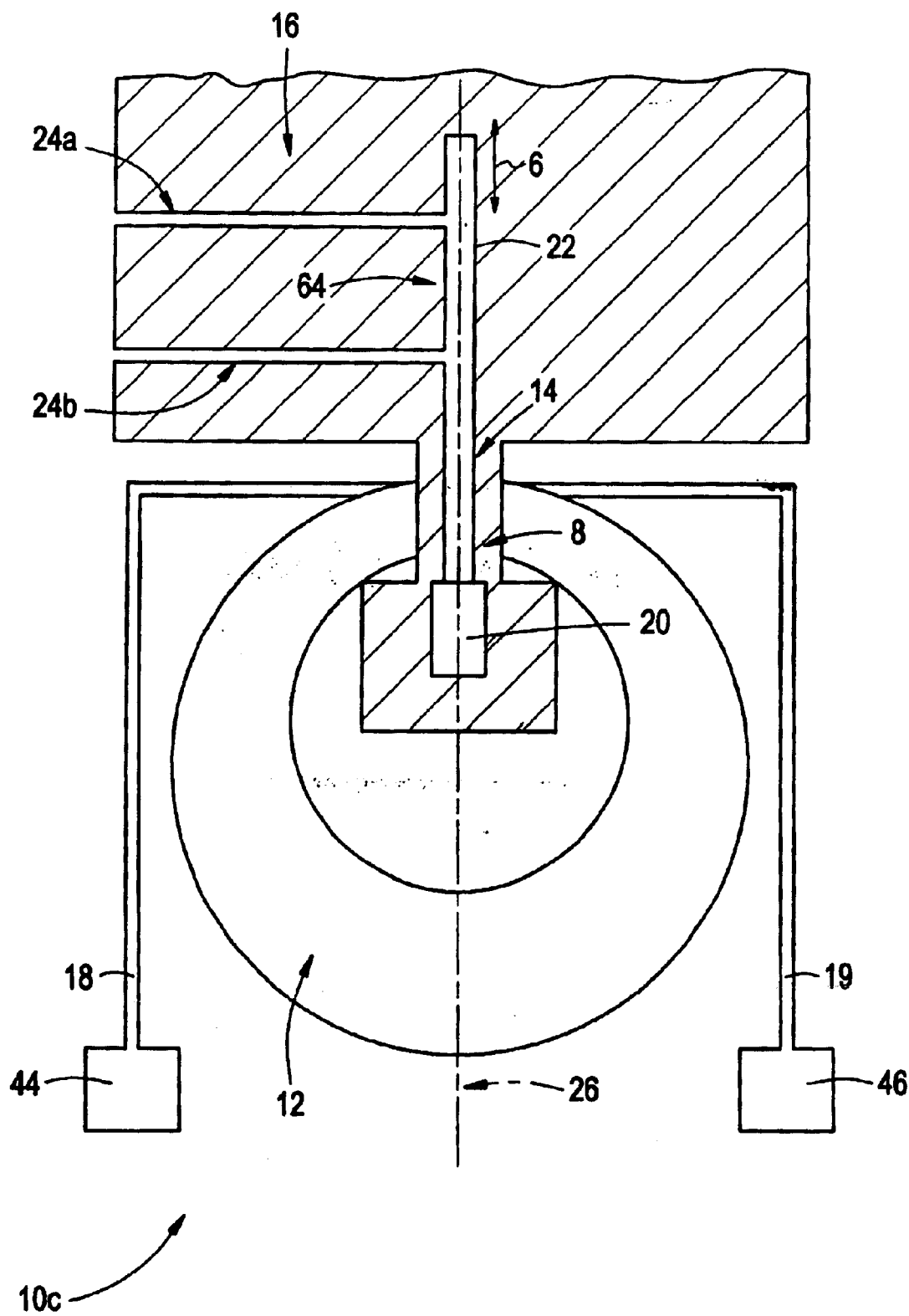
FIG. 7A is a top view of another embodiment of a MEMS device disclosed herein, illustrating an embodiment of a double-cantilever structure.
Figure 7B:
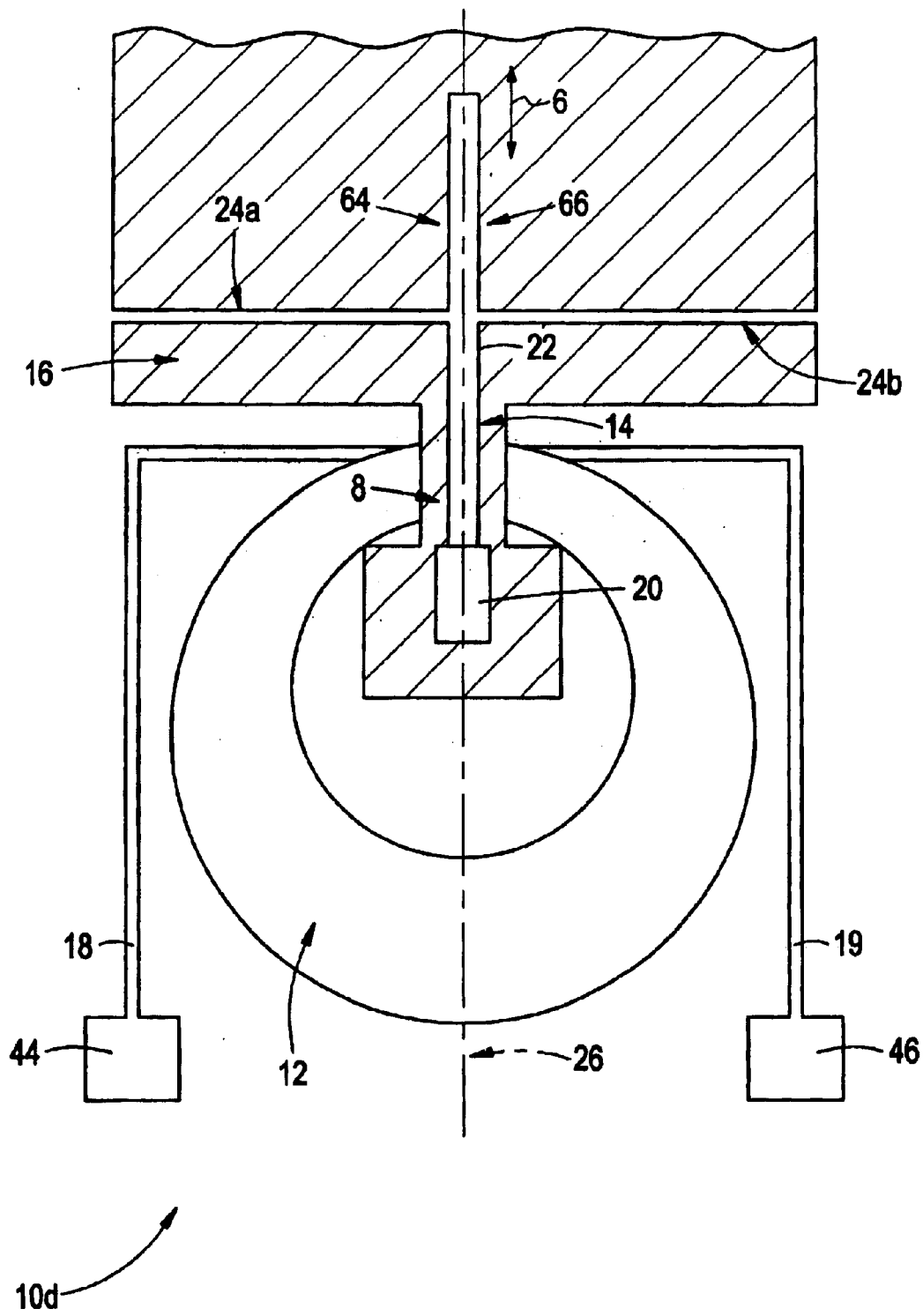
FIG. 7B is a top view of another embodiment of a MEMS device disclosed herein, illustrating another embodiment of a double-cantilever structure.

Other exemplary embodiments of cantilever control mechanisms are shown in FIGS. 7A and 7B. The MEMS device 10c includes a first cantilever 24a and a second cantilever 24b that may be formed from the device layer 52 of the substrate 54 and may be suspended over the base layer 54a and coupled to the arm 22 of the acutable element 14. As shown in FIG. 7A, the first and second cantilevers 24a, 24b may both be coupled to a first side 64 of the arm 22. Alternately, as shown in FIG. 7B, the MEMS device 10d includes a first cantilever 24a that may be coupled to the first side 64 of the arm 22 and a second cantilever 24b that may be coupled to a second side 66 of the arm 22. Also alternately, as shown in FIG. 7B, the first and second cantilevers 24a, 24b may be coupled to the first and second sides 64, 66 of the arm 22 so that the first cantilever 24a is substantially coaxial with the second cantilever 24b.

Various other embodiments of cantilever control mechanisms are possible. For example, any number of cantilevers may be formed from or disposed on the substrate and coupled to the arm 22. In one embodiment, all of the cantilevers may be coupled to the first side 64 of the arm. In another embodiment, a first number of cantilevers may be coupled to the first side 64, and a second number of cantilevers may be coupled to the second side 66. In yet another embodiment, at least one cantilever coupled to the first side 64 may be substantially coaxial with at least one cantilever coupled to the second side 66.

Figure 8A:
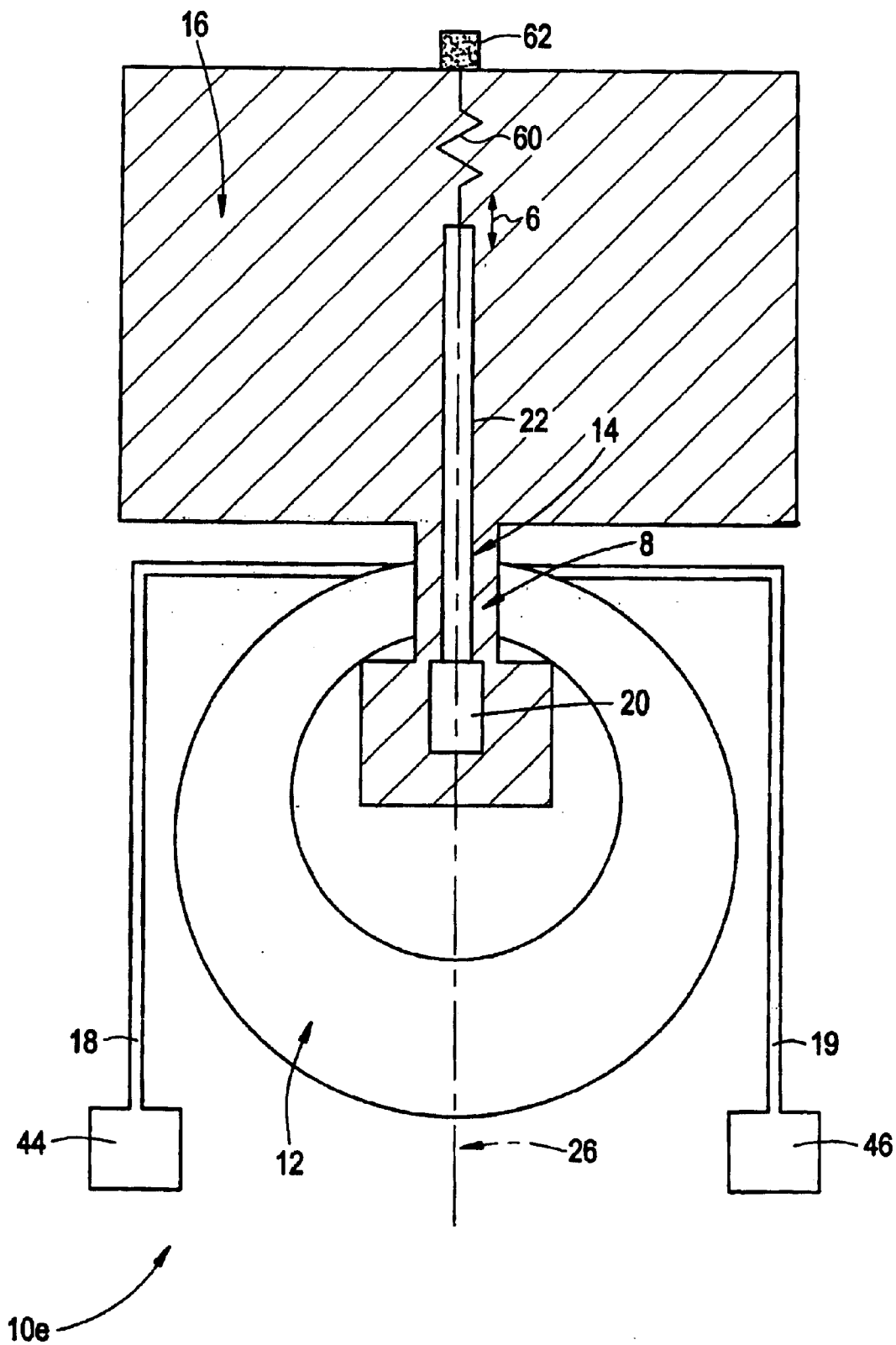
FIG. 8A is a top view of another embodiment of a MEMS device disclosed herein, illustrating an embodiment of a spring.

An exemplary embodiment of a spring control mechanism is shown in FIG. 8A. The MEMS device 10e includes a spring 60 that may be disposed on the substrate and attached to one end of a mounting structure 62 for providing a restoring force to the actuable element 14. The mounting structure 62 may have another end attached to the substrate. The spring 60 may be disposed at a variety of locations and orientations on the substrate. For example, as shown in FIG. 8A, the spring 60 may be mounted along the axis of actuation and attached to the end of the arm of the actuable element 14 located furthest from the base 20. Alternately, the spring 60 may be mounted along the axis of actuation 26 and attached to the base 20 of the actuable element 14. Operation of the spring 60 can be understood in the following manner. As provided previously herein, the actuator 12 selectively generates a first force that tends to displace the actuable element 14 along a path 6 that extends at least partially into the gap 8. The spring 60 selectively applies a second force to the actuable element 14. Like the first force, the second force also acts along the axis of actuation 26. Unlike the first force, however, the second force acts in an opposite direction, and tends to restore the actuable element to its original position on the path. A procedure similar to that previously provided herein may be followed to effect displacement of the actuable element 14. The spring 60 may be comprised of any material known to one of ordinary skill in the art to be suitable for a MEMS spring, for example, Si and Ti. The magnitude of the restoring force applied by the spring 60 depends on a variety of factors, including the spring constant of the spring 60, which itself depends on the type of material comprising the spring 60 and the physical dimensions of the spring 60, such as the number of spring coil turns and the length, width, and thickness of the spring.

Figure 8B:
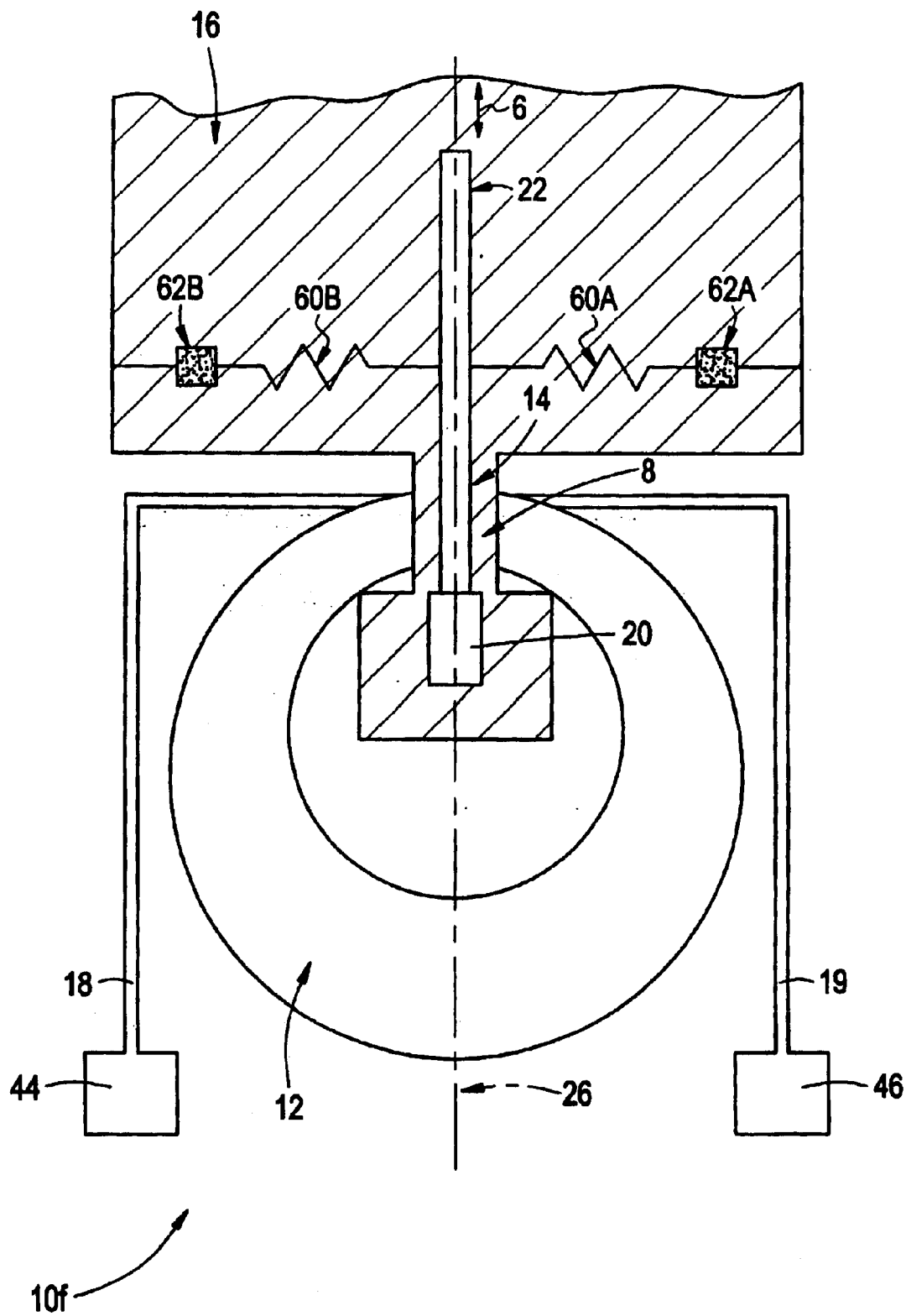
FIG. 8B is a top view of another embodiment of a MEMS device disclosed herein, illustrating another embodiment of a spring.

Another exemplary embodiment of the spring control mechanism is shown in FIG. 8B. The MEMS device 10f includes two springs 60A and 60B attached to mounting structures 62A, 62B, respectively, for providing a restoring force to the actuable element 14. The mounting structures 62A, 62B are also attached to the substrate. A procedure similar to that previously provided herein may be followed to control the displacement of the actual element 14 using the springs 60A and 60B.

Various other embodiments of spring control mechanisms are possible. For example, any number of springs may be diposed on the substrate and coupled to the arm 22. In one embodiment, all of the springs may be coupled to the first side 64 of the arm 22. In another embodiment, a first number of springs may be coupled to the first side 64, and a second number of springs may be coupled to the second side 66. Additionally, any number of springs may be coupled to the arm 22 and the base 20 and mounted along the axis of actuation 26.

As described below, the actuable element 14, including the base 20 and the arm 22, may be formed directly from the substrate material. In the exemplary embodiments illustrated in FIGS. 1A, 1B, 7A, and 7B, for example, the actuable element 14 is formed directly from the device layer 52 and is, thus, suspended over the base layer 54a. Each of the control mechanisms, including the cantilever 24, the spring 60, the clamp 85, and the stop 92, may also be formed directly from the substrate material. Alternately, the actuable element 14, as well as each of the control mechanisms, may be deposited, built upon, or otherwise added to the substrate. Forming both the control mechanism, including cantilever(s) 24, spring(s) 60, clamp(s) 85, and stop(s) 92, and the actuable element 14 from the substrate may result in a more robust connection between the control mechanism and the actuable element 14 and may reduce manufacturing steps.

The MEMS devices disclosed herein may optionally include a suspension system that suspends the actuable element above the substrate to minimize friction between the actuable element and the surface of the substrate during operation. In one exemplary embodiment, the suspension system may include a mechanical support, such as one or more clamps, cantilevers, or springs, as previously provided herein. In another exemplary embodiment, the suspension system may use two or more permanent magnets to provide a magnetic suspending force on the actuable element. In another exemplary embodiment, the suspension system may use one or more electrically activated magnetic coils that selectively provide a magnetic suspending force on the actuable element.

Figure 9A:
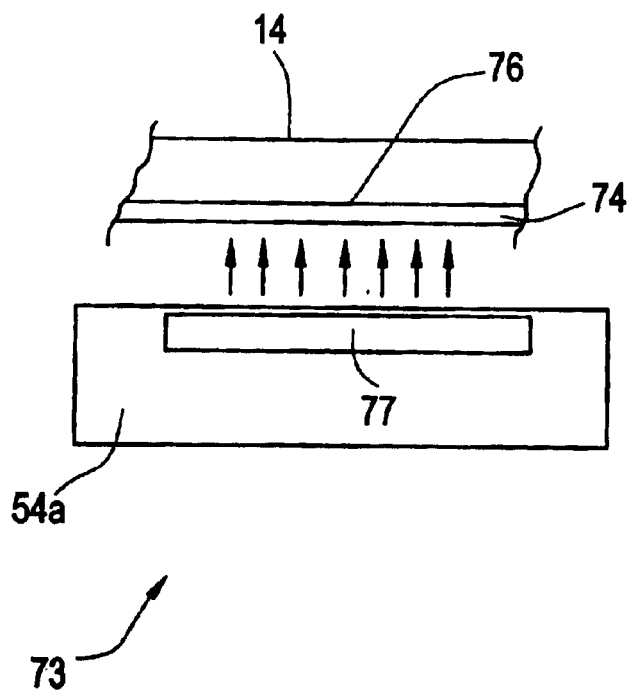
FIG. 9A is a schematic view of a magnetic suspension system.

An exemplary embodiment of a magnetic suspension system is shown in FIG. 9A. The magnetic suspension system 73 provides a magnetic force for suspending the actuable element 14 above the base layer 54a. The magnetic suspension system 73 may include a first magnet 74 coupled to the bottom surface 76 of the actuable element 14. The first magnet 74 may extend the entire length of the actuable element 14, or may be discretely positioned on the actuable element 14. The magnetic suspension system 73 may also include a second magnet 77 embedded in or positioned on the base layer 54a. Preferably, the first and second magnets 74, 77 are permanent magnets. For example, the first and second magnets 74, 77 may be cobalt alloy magnets. Preferably, the poles of the first and second magnets 74, 77 are oriented such that a repulsive magnetic force acts on the actuable element 14 to suspend the actuable element 14 above the base layer 54a. The repulsive force is indicated schematically by arrows in FIG. 9A.

Figure 9B:
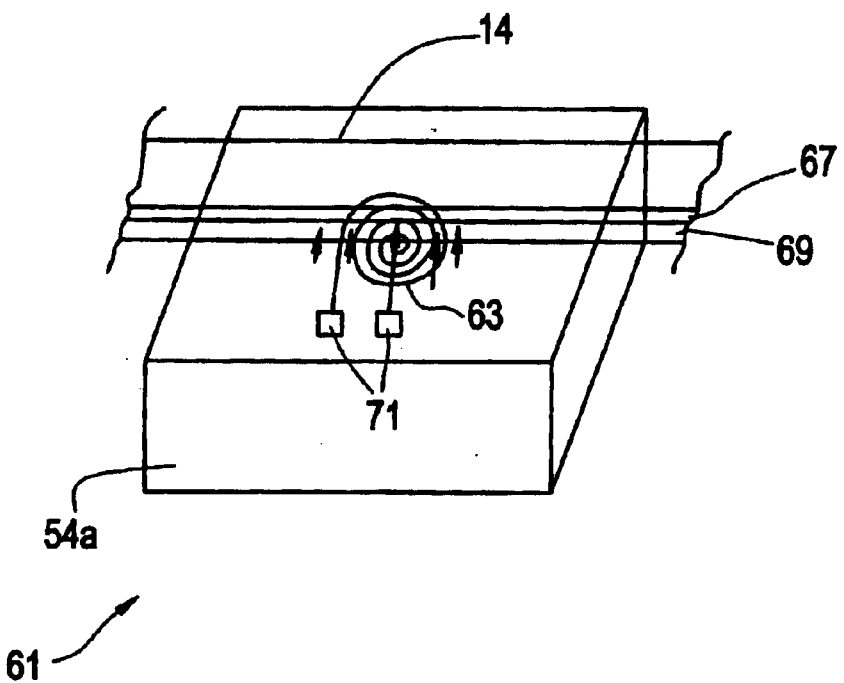
FIG. 9B is a schematic view of an electromagnetic suspension system.

An exemplary embodiment of an electromagnetic suspension system is shown in FIG. 9B. The electromagnetic suspension system 61 provides a suspension force to the actuable element 14. Preferably, the electromagnetic suspension system 61 is positioned on the surface of the base layer 54a. As shown in FIG. 9B, the electromagnetic suspension system 61 may include a coil 63 of electrically conductive material connected to leads 71. An electromagnetic suspension system including a coil of electrically conductive material may be constructed in a manner known by one of ordinary skill in the art. The coil of electrically conductive material may be constructed in the manner shown in U.S. Pat. No. 5,778,513 to Miu et al., the contents of which are incorporated by reference herein. Alternately, the electromagnetic suspension system 61 may include coils of electrically conductive material wrapped about a core of soft magnetic material in a manner analogous to a solenoid. The coil 63 is connected to an external power source (not shown). In this embodiment, the actuable element 14 may include a core 67 of non-magnetic material to which a layer of permanent magnet material 69 may be attached. The magnetic layer 69 may extend the entire length of the actuable element 14, or may be discretely positioned on the actuable element 14. Upon the application of a current to the electromagnetic suspension system 61, the coils 63 and the core 65 generate a force that tends to repel the layer of permanent magnet material 69, thereby suspending the actuable element 14 above the base layer 54a. The repulsive force is indicated schematically by arrows in FIG. 9B. Removing current from the electromagnetic system 61 causes the layer of permanent magnet material 69 to be attracted to the coils 63, thereby latching the actuable element 14 in place on the base layer 54a. The electromagnetic suspension system 61 thus allows selective suspension and latching of the actuable element 14. The electromagnetic suspension system 61 may be constructed in a manner analogous to that for the electromagnetic actuator described below.

Figure 10:
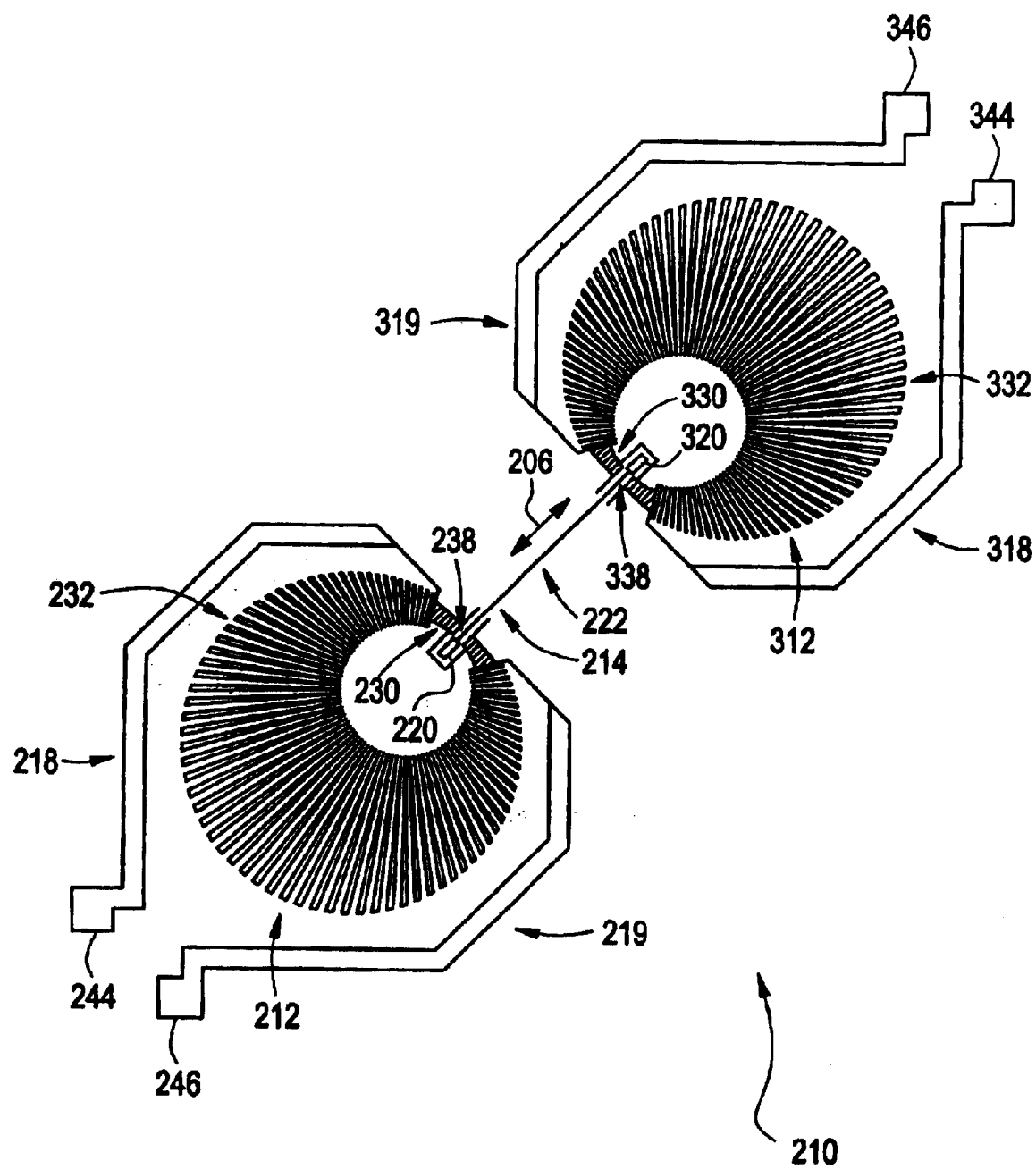
FIG. 10 is a top view of another embodiment of a MEMS device disclosed herein, the embodiment having two MEMS actuators and a single actuable element.

Another exemplary embodiment of the MEMS device disclosed herein is shown in FIG. 10. The MEMS device 210 includes a first MEMS actuator 212, a second MEMS actuator 312, and an actuable element 214. The first and second MEMS actuators 212, 312 may include magnetic cores 230, 330, electrically conductive coils 232, 332 wrapped around the cores 230, 330, leads 218, 219, 318, and 319, and electrode pads 244, 246, 344, and 346. The actuable element 214 includes a first base 220, a second base 320, and an arm 222 coupled to the first and second bases 220, 320. The first actuator 212 includes a gap 238 through which the actuable element 214 can be displaced. The second actuator 312 also includes a gap 338 through which the actuable element 214 can be displaced. The MEMS device 210 and its constituent parts are disposed on a substrate having a substantially planar surface.

In an exemplary embodiment, the first and second MEMS actuators 212, 312 may jointly provide a control mechanism for the actuable element 214. Operation of this embodiment of the MEMS device 210 may be understood in the following manner. First, the first actuator may be energized in a manner similar to that previously provided herein. Second, the first actuator 212 may selectively generate a first force that tends to displace the actuable element 214 along a path 206 that extends at least partially into the gaps 238, 338. Third, after the actuable element 214 reaches a desirable position on the path 206, the second actuator 312 may be energized. Fourth, the first actuator 212 may be de-energized, and the second actuator 312 may be energized to provide a second force. Like the first force, the second force is directed along the path 206. Unlike the first force, however, the second force is directed opposite to the first force, and tends to restore the actuable element 214 to its original position on the path 206.

Other modes of operating the first and second actuators 212, 312 to control the displacement of the actuable element 214 are possible. For example, the first and second actuators 212, 312 may be designed to continuously provide first and second forces to the actuable element 212. In this embodiment, displacement of the actuable element 214 may be controlled by controlling the relative strengths of the first and second forces. Additionally, the first and second actuators 212, 312 may be selectively energized to permit oscillation of the actuable element 214 along a path 206 extending through the gaps 238, 338.

As shown in FIG. 10, the second MEMS actuator 312 may be an electromagnetic actuator. Alternately, the second MEMS actuator 312 may be any other type of MEMS actuator known to one of ordinary skill in the art, including, but not limited to, an electrostatic actuator, a thermal actuator, and a piezoelectric actuator. In these embodiments, the actuable element 214 may be modified to include a portion comprised of an electrically conductive material, a thermally sensitive material, and a piezoelectric material, respectively.

A control mechanism for limiting the displacement of the actuable element 214 in a direction away from the substrate may also optionally be provided. Suitable control mechanisms may include one or more cantilevers, springs, or clamps.

As shown in FIG. 10, each of the path 206, the first and second actuators 212, 312, and the actuable element 214 lies in a plane that is substantially parallel to the substantially planar surface of the substrate. Alternately, any combination of the path 206, the first and second actuators 212, 312, and the actuable element 214 may lie in a plane that is inclined at an angle to the substantially planar surface of the substrate. Also alternately, any combination of the path 206, first and second actuators 212, 312, and the actuable element 214 may include constituent portions that are not coplanar with each other. Additionally, any combination of the path 206, the first and second actuators 212, 312, and the actuable element 214 may be formed from or disposed on the substrate.

Figure 11:
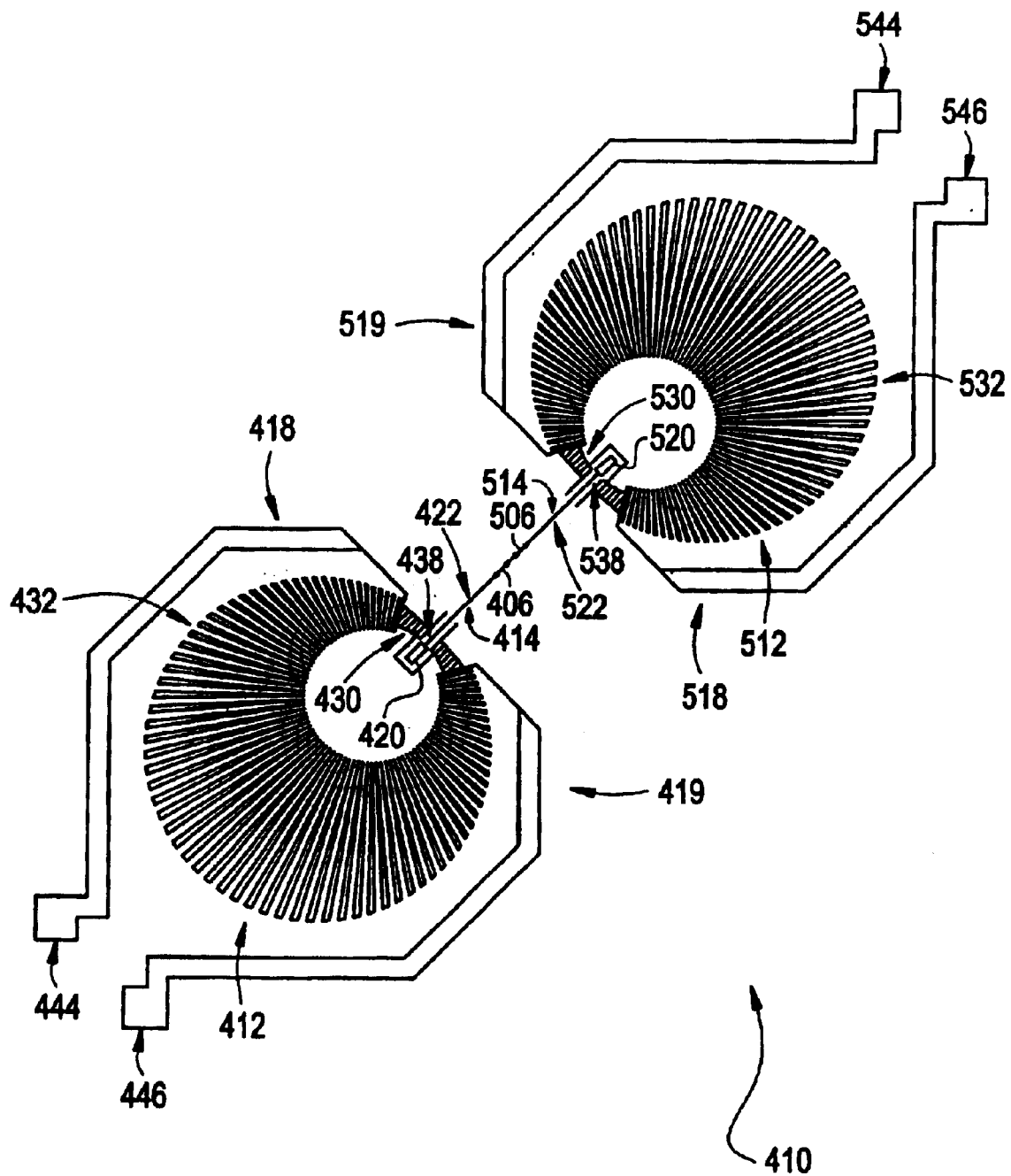
FIG. 11 is a top view of another embodiment of a MEMS device disclosed herein, the embodiment having two MEMS actuators and two actuable elements.

Another exemplary embodiment of the MEMS device disclosed herein is shown in FIG. 11. The MEMS device 410 includes a first MEMS actuator 412, a first actuable element 414, a second MEMS actuator 512, and a second actuable element 514. The first and second MEMS actuators 412, 512 may include magnetic cores 430, 530, electrically conductive coils 432, 532 wrapped around the cores 430, 530, leads 418, 419, 518, and 519, and electrode pads 444, 446, 544, and 546. The first actuable element 414 includes a first base 420 and a first arm 422 coupled to the first base 420, and the second actuable element 514 includes a second base 520 and a second arm 522 coupled to the second base. The first actuator 412 includes a gap 438 through which the first actuable element 414 can be displaced, and the second actuator 512 includes a gap 538 through which the second actuable element 514 can be displaced. The MEMS device 410 and its constituent parts may be formed from or disposed on a substrate having a substantially planar surface.

Operation of the MEMS device 410 is based on principles previously provided herein. In one embodiment, the MEMS device 410 may be operated to provide simultaneous or separate actuation of the first and second actuable elements 414, 514. For example, the first MEMS actuator 412 may selectively apply a first force to the first actuable element 414 to displace the first actuable element 414 along a first path 406 that extends at least partially into the gap 438. Also in this embodiment, the second MEMS actuator 512 may selectively apply a second force to the second actuable element 514 to displace the actuable element 514 along a second path 506 that extends at least partially into the gap 538.

In a variety of exemplary embodiments, the MEMS device 410 may be modified to include one or more of the exemplary control mechanisms previously provided herein, including, but not limited to, a stop, a clamp, a cantilever, a spring, a suspension system, and an additional MEMS actuator. For example, one or more stops may be disposed on the substrate to selectively inhibit displacement of the first and/or second actuable elements 414, 514. Also, one or more clamps may be disposed on the substrate for selectively clamping and/or limiting displacement of the first and/or second actuable elements 414, 514 in a direction away from the substrate. Additionally, one or more cantilevers may be suspended over the substrate and coupled to the first and/or second arms 422, 522 of the first and second actuable elements 414, 514. Further, one or more springs may be disposed on the substrate and coupled to the first and/or second arms 422, 522 of the first and second actuable elements 414, 514. Further still, one or more additional MEMS actuators may be disposed on the substrate to provide a joint control mechanism for the first and/or second actuable elements 414, 514. Further yet still, one or more suspension mechanisms may be disposed on the substrate to provide a suspending forces to the first and/or second actuable elements 414, 514.

In another variety of exemplary embodiments, the MEMS device 410 may be modified to include any combination of the control mechanisms previously provided herein. For example, one or more cantilevers may be disposed on the substrate and coupled to the first actuable element 414, and one or more springs may be disposed on the substrate and coupled to the second actuable element 514.

As shown in FIG. 11, each of the first and second paths 406, 506, first and second actuators 412, 512, and first and second actuable elements 414, 514 is substantially planar, and each of the first and second paths 406, 506, the first and second actuators 412, 512, and the first and second actuable elements 414, 514 lies in a plane that is substantially parallel to the substantially planar surface of the substrate. Alternately, any combination of the first and second paths 406, 506, the first and second actuators 412, 512, and the first and second actuable elements 414, 514 may lie in a plane that is inclined at an angle to the substantially planar surface of the substrate. For example, the first actuator 412 and first actuable element 414 may be substantially planar and lie in a first plane, and the second actuator 512 and second actuable element 514 may also be substantially planar and lie in a second plane oriented at an angle with respect to the first plane. Also alternately, any combination of the first and second paths 406, 506, the first and second actuators 412, 512, and the first and second actuable elements 414, 514 may include constituent portions that are not coplanar with each other.

Another exemplary embodiment of the MEMS device disclosed herein includes an array having any number of MEMS actuators, any number of actuable elements, and any number of control mechanisms disposed on a substrate. In one exemplary embodiment, all of the MEMS actuators, actuable elements, and control mechanisms may be disposed in the same plane and may be oriented at a variety of angles with respect to each other. In another exemplary embodiment, one or more of the MEMS actuators and/or actuable elements and/or control mechanisms may be disposed in planes that are oriented at a variety of angles with respect to each other and with respect to the substrate.

Advantageously, the MEMS devices disclosed herein may be used to generate forces sufficient to displace an actuable element along paths having lengths between approximately 1 $\mu$m and approximately 3,000 $\mu$m. The actual amount of displacement of the actuable element depends on a variety of design factors, including the elasticity of the control mechanism and the physical parameters of the electromagnetic actuator, such as the amount of current applied to the actuator, the number of coil turns, and the permeability and saturation of the material from which the magnetic core is constructed.

The MEMS devices disclosed herein may be incorporated into a variety of structures, including, but not limited to, electrical switches, fluid pumps, fluid valves, optical attenuators, optical switches, tunable filters, and gratings. Details of fabrication of these devices are provided below.

Figure 12:
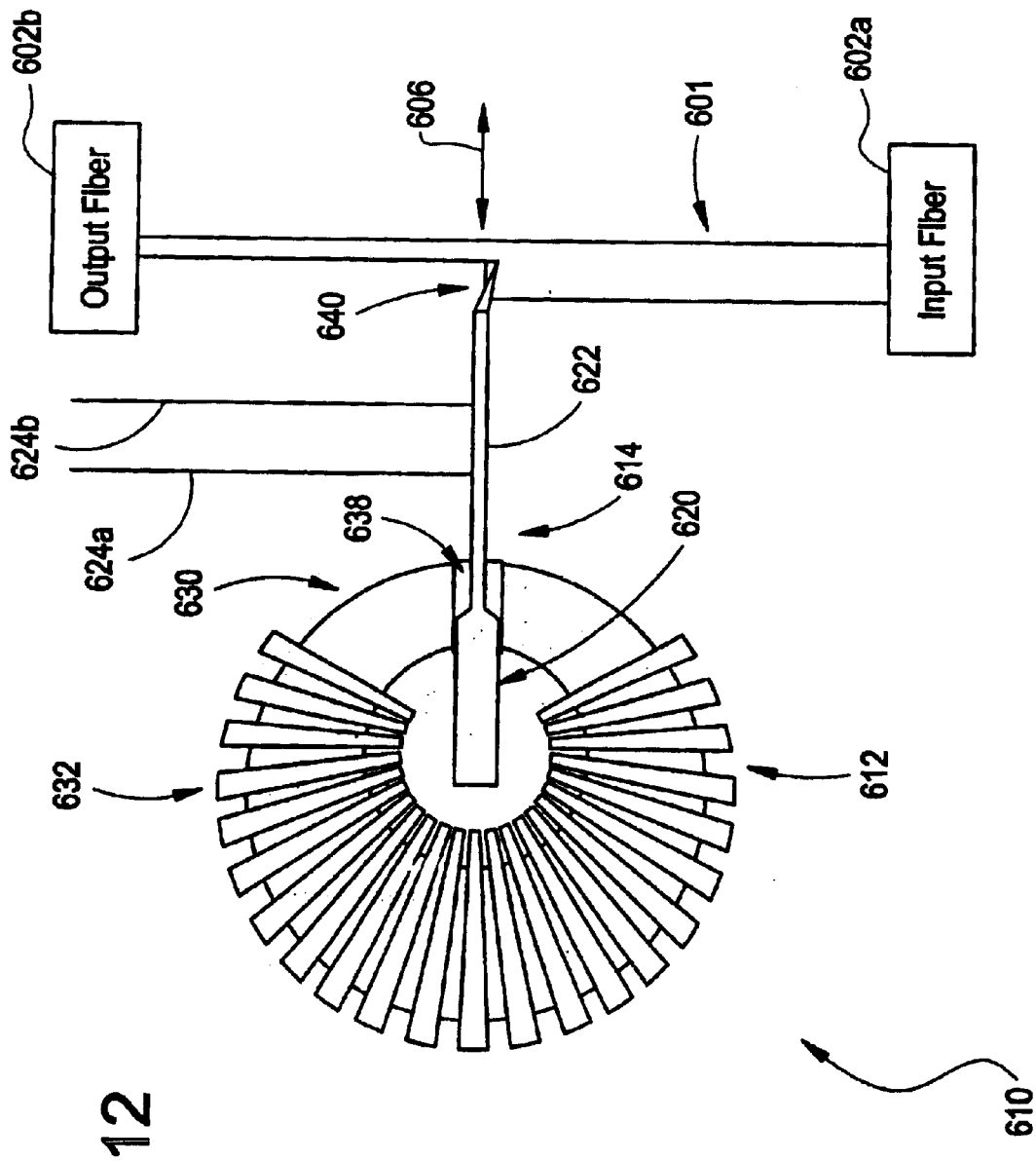
FIG. 12 is a top view of another embodiment of a MEMS device disclosed herein, illustrating an optical attenuator.

An exemplary embodiment of the MEMS device disclosed herein incorporated into an optical attenuator is shown in FIG. 12. The MEMS device 610 includes a MEMS actuator 612 and an actuable element 614. The MEMS actuator 612 may be constructed in a manner similar to that previously provided herein to include a magnetic core 630 and electrically conductive coil 632 wrapped around the core 630. The MEMS actuator 612 also includes a core gap 638 through which the actuable element 614 can be displaced. The actuable element 614 includes a base 620 and an arm 622 coupled to the base 620. The actuable element 614 also includes a shutter 640 coupled to the arm 622. Optionally, the actuable element 614 may include first and second cantilevers 624a, 624b coupled to the arm 622 of the actuable element 614. The MEMS device 610 and its constituent parts are disposed on a substrate having a substantially planar surface.

Operation of the MEMS device 610 is based on principles previously provided herein. In this embodiment, the actuable element 614 includes an optical element that may be displaced along an optical path 606 intersecting an input optical fiber 602a and an output optical fiber 602b. By selectively applying an operating current to the actuator 612, the actuable element 614 and the shutter 640 can be selectively positioned within the optical path 606 to attenuate the optical beam 601 between the optical fibers 602a and 602b. In this manner, the MEMS device 610 can function as a variable optical attenuator. The MEMS device 610 provides precise electronic control of the optical signal level between the optical fibers 602a, 602b by selectively moving the shutter 640 into and out of the optical path 606 between the optical fibers 602a, 602b.

A variety of constructions are possible for the shutter 640. For example, the shutter 640 may be constructed of opaque material or may include an opaque surface for blocking the optical beam 601 when positioned in the optical path 606. Alternately, the shutter 640 may be constructed from a reflective material or may include a reflective surface. Suitable reflective materials include gold or any other reflective material selected based on the wavelength of the optical signal. Also alternately, the shutter 640 may be constructed from a semi-transparent or a semi-reflective material or may include a semi-transparent or a semi-reflective surface. Preferably, the shutter 640 is positioned on the arm 622 of the actuable element 614 so that the surface of the shutter 640 facing the input optical fiber 602a is oriented at an angle to the optical path 606. In this manner, the shutter 640 may operate to reflect at least a portion of the optical beam 601 away from the output optical fiber 602b when the shutter 640 is positioned in the optical path 606. Additionally, in this manner, the shutter 640 may operate to inhibit reflection of the optical beam 601 onto the input optical fiber 602a. Preferably, however, the shutter 640 is constructed from a non-opaque material, to reduce the absorption of the optical beam 601 by the shutter 640 and consequential heating.

The shutter 640 may be a separate component disposed on the substrate and coupled to the actuable element 614. Alternately, the shutter 640 may be formed from the actuable element 614 by, for example, coating a section of the actuable element 614 with an opaque or reflective coating.

By selecting the desired optical element, the MEMS device 610 may be used with any optical component known to one of ordinary skill in the art to facilitate control or manipulation of an optical beam 601. For example, instead of a shutter 640, the actuable element 614 may include an optical filter, a tunable optical grating, or a mirror. A variety of other optical components may also be constructed using the MEMS device 610. For example, the actuable element 614 may include a mirror, and the MEMS device 610 may function to selectively switch the optical beam between two optical fibers. Also, the MEMS device 610 may be used to control or modulate the intensity of a beam of particles, for example, a beam of atoms or subatomic particles.

As shown in FIG. 12, the input and output optical fibers 602a, 602b and the optical beam 601 are substantially planar, and lie in a plane substantially parallel to the substantially planar surface of the substrate. Alternately, the input and output optical fibers 602a, 602b and the optical beam 601 may lie in a plane that is inclined at an angle to the substantially planar surface of the substrate. For example, the optical fibers 602a, 602b and the optical beam 601 may lie in a plane that is perpendicular to the substantially planar surface of the substrate. Also alternately, any combination of the optical fibers 602a, 602b and the optical beam 601 may include constituent portions that are not coplanar with each other.

Figure 13:
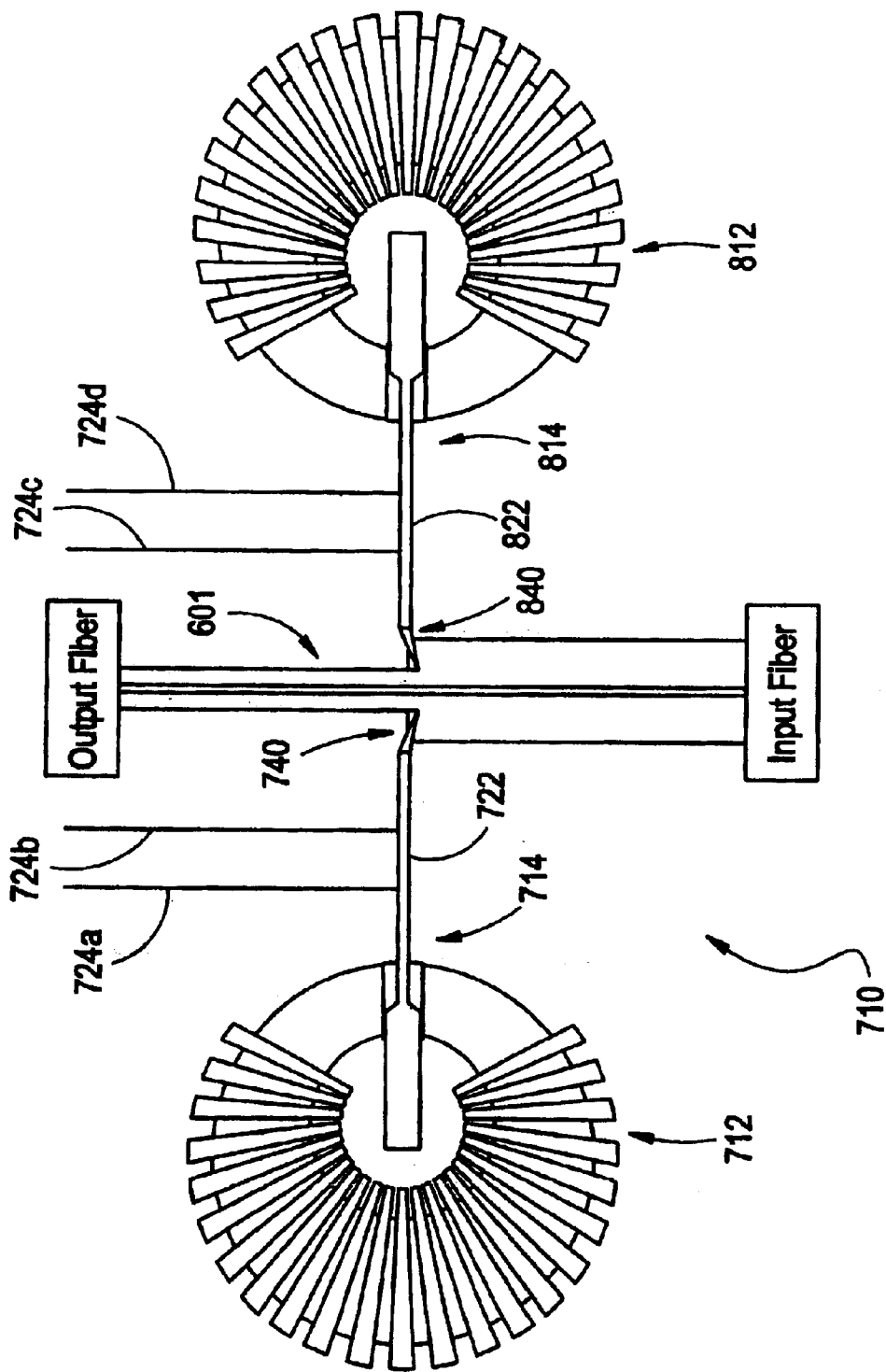
FIG. 13 is a top view of another embodiment of a MEMS device disclosed herein, illustrating another embodiment of an optical attenuator.

Another exemplary embodiment of the MEMS device disclosed herein incorporated into an optical attenuator is shown in FIG. 13. The MEMS device 710 includes first and second MEMS actuators 712, 812 and first and second actuable elements 714, 814. The first and second actuable elements 714, 814 include first and second shutters 740, 840 coupled to the arms 722, 822. Optionally, the first and second actuable elements 714, 814 may include cantilevers 724a, 724b, 724c, 724d coupled to the arms 722, 822 of the actuable elements 714, 814. The MEMS device 710 and its constituent parts are disposed on a substrate having a substantially planar surface.

Operation of the MEMS device 710 is based on principles previously provided herein. In this embodiment, the actuable elements 714, 814 comprise two optical elements having two shutters 740, 840. The first and second shutters 740, 840 may have a variety of relative shapes and orientations. For example, the first and second shutters 740, 840 may be shaped and arranged to permit the first shutter 740 to overlap the second shutter 840 upon joint actuation. In this embodiment, the first and second shutters 740, 840 may have mated or interlocking shapes. Also, the first and second shutters 740, 840 may be shaped and arranged to permit the first shutter 740 to contact the second shutter 840 upon actuation. Additionally, the first and second shutters 740, 840 may be disposed at different locations on the substrate to provide staggered attenuation of the optical beam 601.

Figure 14:
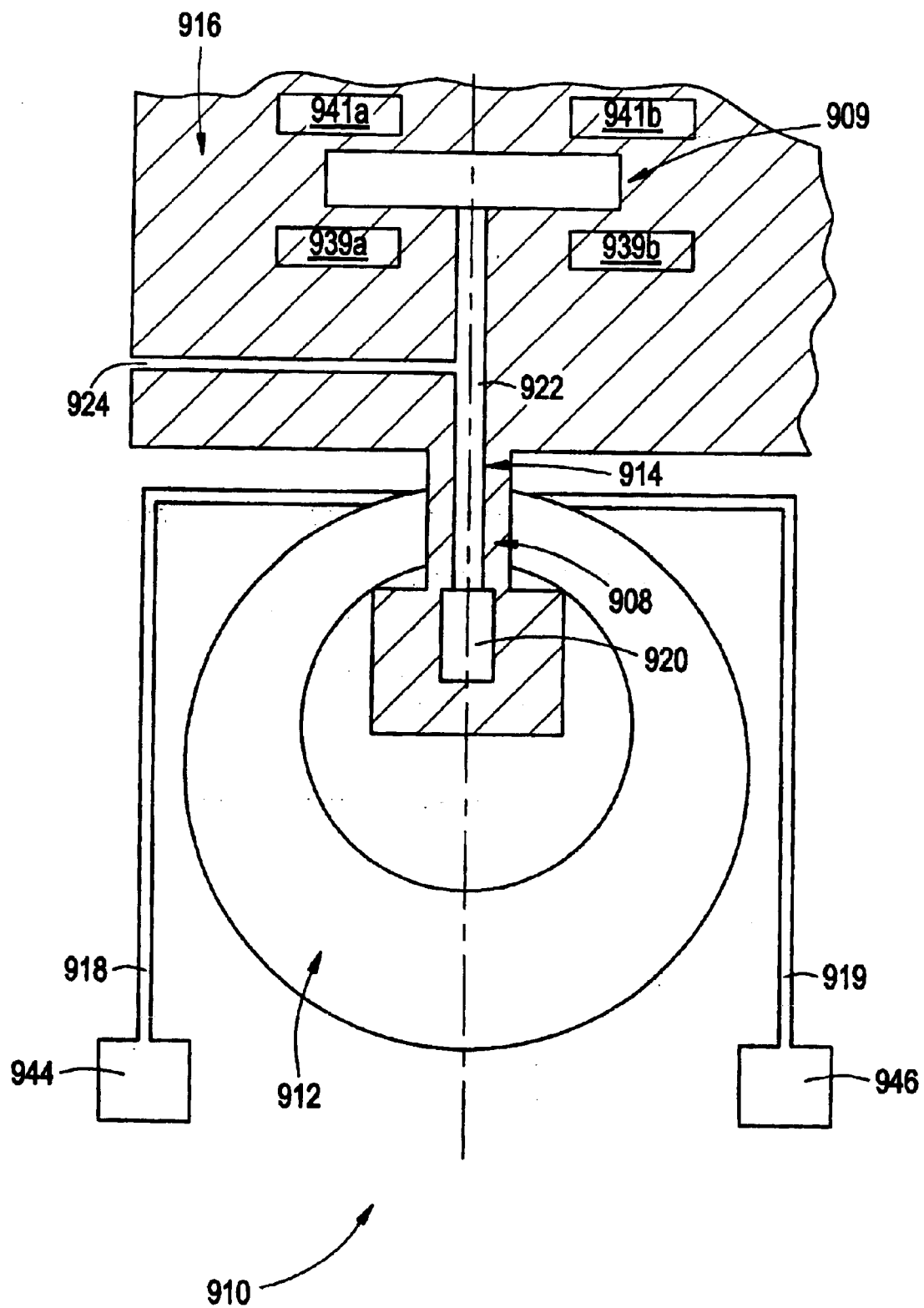
FIG. 14 is a top view of another embodiment of a MEMS device disclosed herein, illustrating an electrical switch.

An exemplary embodiment of the MEMS device disclosed herein incorporated into an electrical switch is shown in FIG. 14. The MEMS device 910 includes a MEMS actuator 912 and an actuable element 914. The MEMS actuator 912 may be constructed in a manner similar to that previously provided herein to include a gap 908 through which the actuable element 914 can be displaced. The actuable element 914 includes a base 920 and an arm 922 coupled to the base 914. The actuable element 914 also includes a contact bar 909 coupled to the arm 922. The MEMS device 910 also includes a first pair of electrical contacts 939a, 939b and a second pair of electrical contacts 941a, 941b. The electrical contacts 939a, 939b, 941a, 941b may be connected to other electrical circuit elements (not shown). The MEMS device 910 and its constituent parts are disposed on a substrate having a substantially planar surface. The actuable element 914 may be suspended over a cavity 916 in the substrate.

Operation of the MEMS device 910 is based on principles previously provided herein. In this embodiment, the actuable element 914 comprises an electrical element that may be displaced along a path 906 contacting the first pair of electrical contacts 939a, 939b and the second pair of electrical contacts 941a, 941b. By selectively applying an operating current to the actuator 912, the actuable element 914 and the contact bar 909 can be selectively displaced along the path 906 to complete an electrical connection between either the first pair of electrical contacts 939a, 939b or the second pair of electrical contacts 941a, 941b. The electrical contacts 939a, 939b, 941a, and 941b and the contact bar 909 form two switches that may be selectively closed. In this manner, the MEMS device 910 can function as an electrical switch.

As shown in FIG. 14, each of the MEMS actuator 912, the actuable element 914, the contact bar 909, and the electrical contacts 939a, 939b, 941a, and 941b lies in a plane that is substantially parallel to the substantially planar surface of the substrate. Alternately, any combination of the MEMS actuator 912, the actuable element 914, the contact bar 909, and the electrical contacts 939a, 939b, 941a, and 941b may lie in a plane that is inclined at an angle to the substantially planar surface of the substrate. Also alternately, any combination of the MEMS actuator 912, the actuable element 914, the contact bar 909, and the electrical contacts 939a, 939b, 941a, and 941b may include constituent portions that are not coplanar with each other.

Figure 15A:
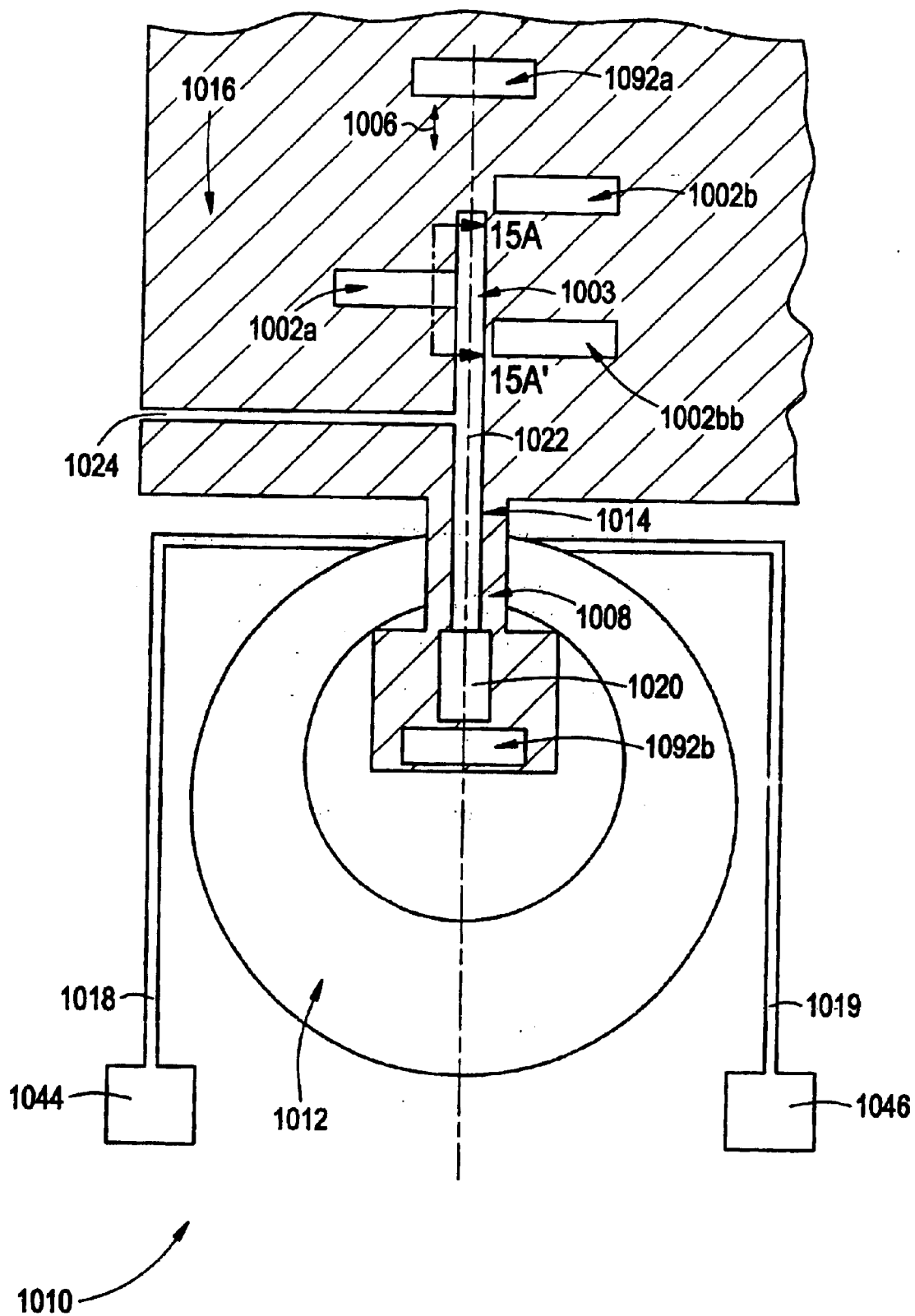
FIG. 15A is a top view of another embodiment of a MEMS device disclosed herein, illustrating an optical switch.
Figure 15B:
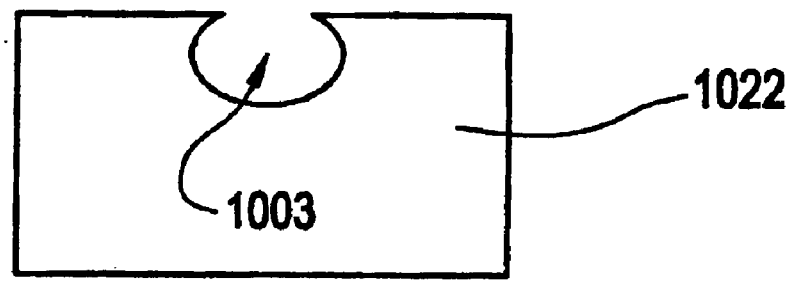
FIG. 15B is a side elevation view of the actuable element of a MEMS device shown in FIG. 14A along the line A–A'.

An exemplary embodiment of the MEMS device disclosed herein incorporated into an optical switch is shown in FIGS. 15A and 15B. As shown in FIG. 15A, the MEMS device 1010 includes a MEMS actuator 1012 and an actuable element 1014. The MEMS actuator 1012 may include a gap 1008 through which the actuable element 1014 can be displaced. The actuable element 1014 includes a base 1020 and an arm 1022 coupled to the base 1020. The actuable element may also include a cantilever 1024. The MEMS device 1010 and its constituent parts are disposed on a substrate having a substantially planar surface. The actuable element 1014 may be disposed over a cavity 1016 in the substrate.

As shown in FIGS. 15A and 15B, the actuable element 1014 also includes one or more slots 1003 shaped and arranged to receive a moveable optical fiber 1002a. The moveable optical fiber 1002a may be attached to the slot 1003 using any securing means known to one of ordinary skill in the art, including, but not limited to, an adhesive.

Operation of the MEMS device 1010 is based on principles previously provided herein. In this embodiment, the actuable element 1014 comprises an optical element that may be displaced along a path 1006 intersecting one or more stationary output optical fibers 1002b, 1002bb. By selectively applying an operating current to the actuator 1012, the actuable element 1014 and the optical fiber 1002a can be selectively displaced along the optical path 1006 to align the optical fiber 1002a with one of the stationary fibers 1002b, 1002bb. Alignment of the optical fiber 1002a with one of the optical fibers 1002b, 1002bb results in the transmission of an optical beam between the optical fiber 1002a and one of the optical fibers 1002b, 1002bb. In this manner, the MEMS device 1010 can function as an optical switch.

As shown in FIG. 15A, the MEMS device 1010 also includes walls 1092a and 1092b. The walls 1092a, 1092b are disposed in the path of the actuable element 1014 to facilitate precise alignment of the optical fiber 1002 and one of the optical fibers 1002b, 1002bb. The wall 1092a is disposed such that the optical fiber 1002a will be precisely aligned with the optical fiber 1002b when the actuable element 1014 contacts the wall 1092a. Similarly, the wall 1092b is disposed such that the optical fiber 1002a will be precisely aligned with the optical fiber 1002bb when the actuable element contacts the wall 1092b.

The walls 1092a, 1092b may also be disposed at a variety of other locations on the substrate. For example, the walls 1092a, 1092b may be disposed on opposite sides of the cantilever 1024.

As shown in FIG. 15A, the optical fibers 1002a, 1002b lie in a plane substantially parallel to the substantially planar surface of the substrate. Alternately, the optical fibers 1002a, 1002b may lie in a plane that is inclined at an angle to the substantially planar surface of the substrate. For example, the optical fibers 1002a, 1002b may lie in a plane that is perpendicular to the substantially planar surface of the substrate. Also alternately, any combination of the optical fibers 1002a, 1002b may include constituent portions that are not coplanar with each other.

A variety of other components may also be constructed using the MEMS device 1010. For example, the actuable element 1014 may include one or more slots 1003 shaped and arranged to transport any object along the path 1006.

Figure 16A:
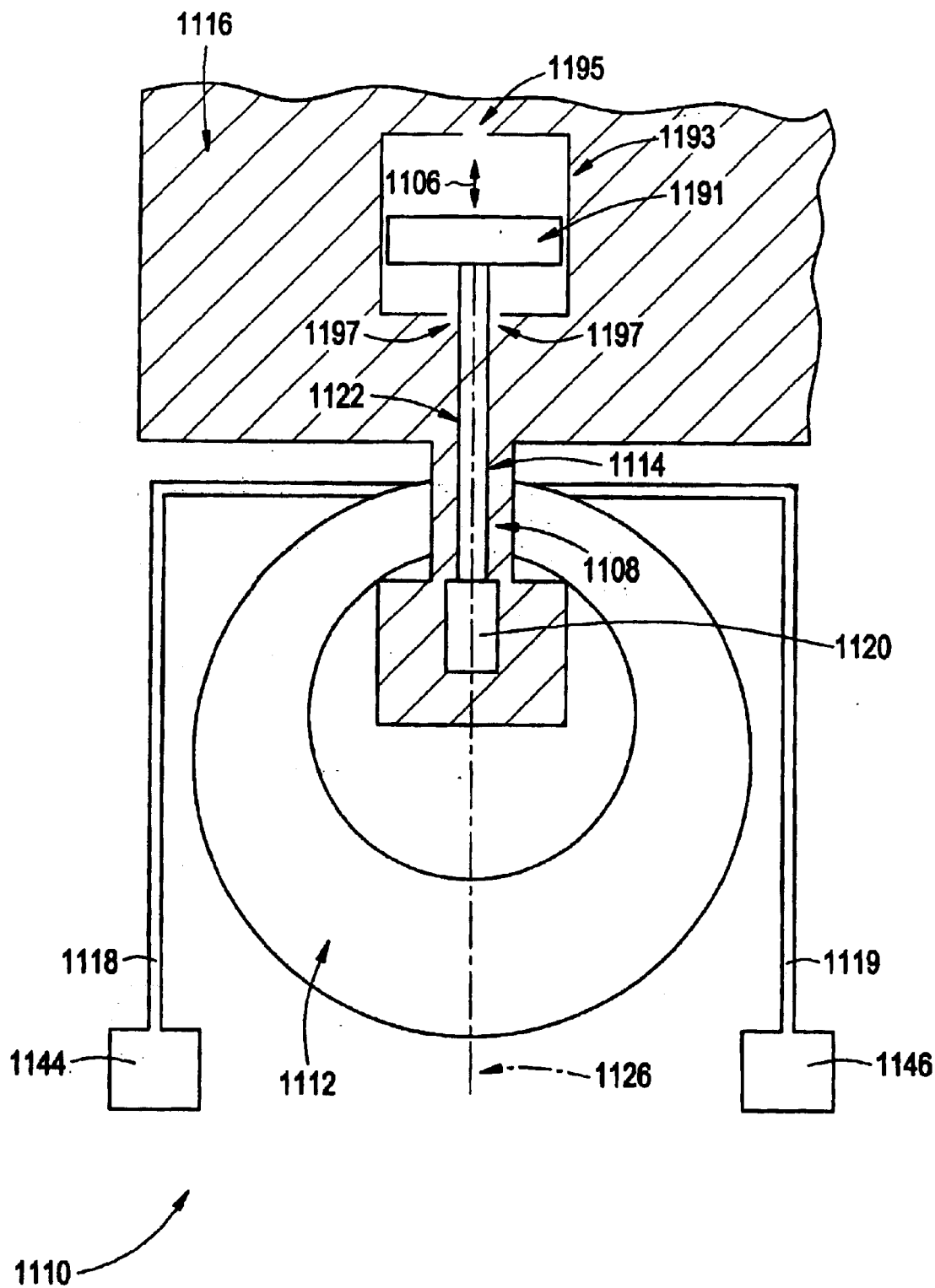
FIG. 16A is a top view of another embodiment of a MEMS device disclosed herein, illustrating a fluid valve.

An exemplary embodiment of the MEMS device disclosed herein incorporated into a fluid valve is shown in FIG. 16A. The MEMS device 1110 includes a MEMS actuator 1112 and an actuable element 1114. The MEMS actuator 1112 may include a gap 1108 through which the actuable element 1114 can be displaced. The actuable element 1114 includes a base 1120 and an arm 1122 coupled to the base 1120. The actuable element 1114 may be disposed over a cavity 1116 in the substrate. The MEMS device 1110 includes a valve 1193 coupled to a source of fluid (not shown). The valve 1193 includes a valve seal 1195, inlets 1197, and a valve element 1191 coupled to the arm 1122 of the actuable element 1114. The MEMS device 1110 and its constituent parts are disposed on a substrate having a substantially planar surface. The MEMS device 1110 also includes a suitable control mechanism (not shown) for controlling the location of the actuable element 1214 in a direction substantially perpendicular to the substantially planar surface of the substrate. This control mechanism may be a clamp, a cantilever, a spring, or a suspension system, as previously provided herein.

Operation of the MEMS device 1110 is based on principles previously provided herein. In this embodiment, the actuable element 1114 comprises a plunger that may be displaced along a path 1106 opening and closing the valve seal 1195. In FIG. 16A, the valve seal 1195 is open. In this state, fluid from a source of fluid (not shown) may flow into the valve 1193 through the inlets 1197, around the valve element 1191, and out of the valve through the valve seal 1195. By selectively applying an operating current to the actuator 1112, the actuable element 1114 and the valve element 1191 can be selectively displaced along the path 1106 to close the valve seal 1195, thereby preventing fluid from flowing through the valve 1193. In this manner, the MEMS device 1110 can function as a fluid valve.

Various other configurations of the MEMS device 1110 are possible. For example, the valve 1193 may be constructed in any manner known to one of ordinary skill the art for constructing a valve that provides controlled fluid flow.

As shown in FIG. 16A, each of the MEMS actuator 1112, the actuable element 1114, and the valve 1193 lies in a plane that is substantially parallel to the substantially planar surface of the substrate. Alternately, any combination of the MEMS actuator 1112, the actuable element 1114, and the valve 1193 may lie in a plane that is inclined at an angle to the substantially planar surface of the substrate. Also alternately, any combination of the MEMS actuator 1112, the actuable element 1114, and the valve 1193 may include constituent portions that are not coplanar with each other.

Figure 16B:
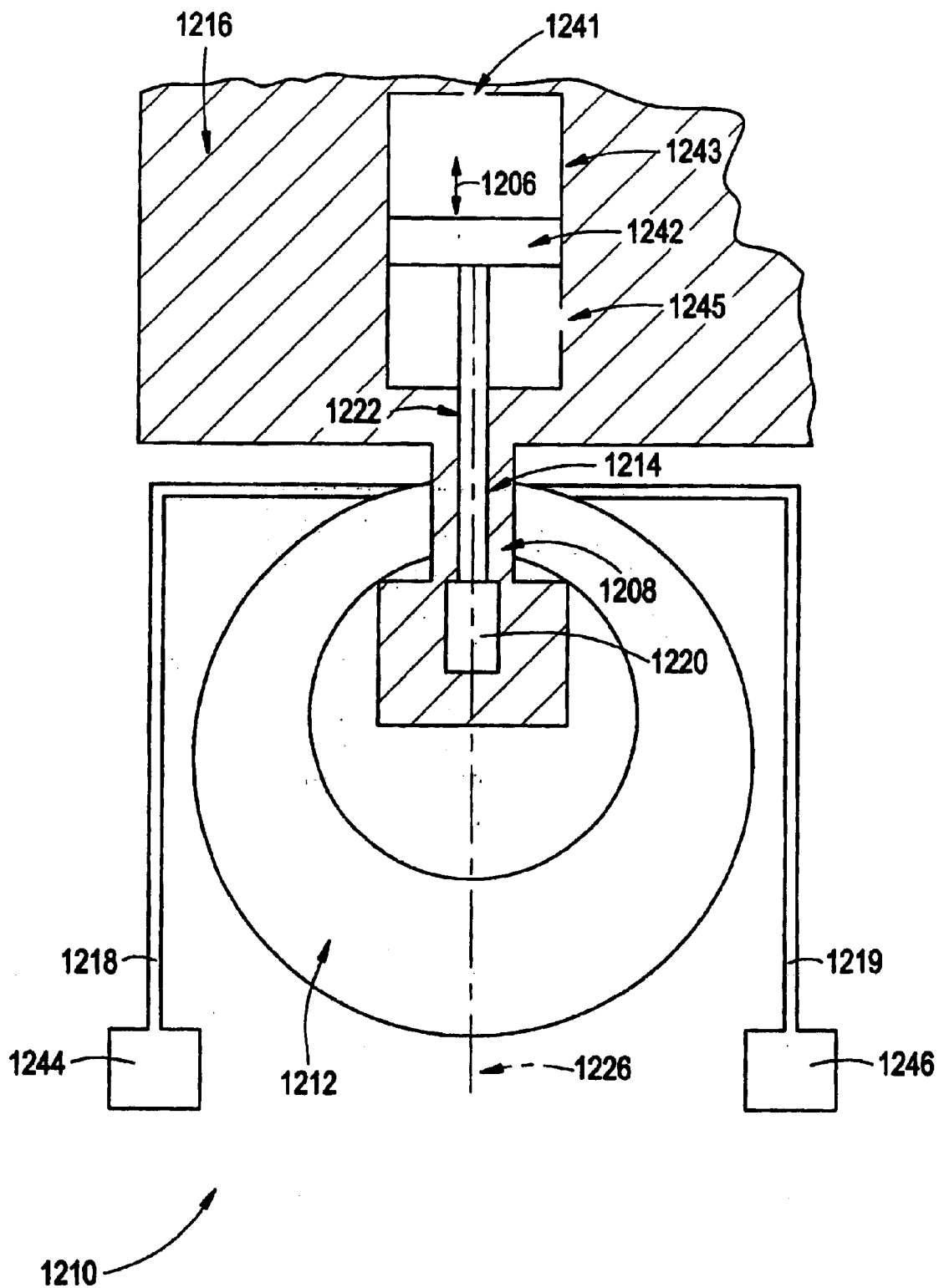
FIG. 16B is a top view of another embodiment of a MEMS device disclosed herein, illustrating a fluid pump.
Figure 17A:
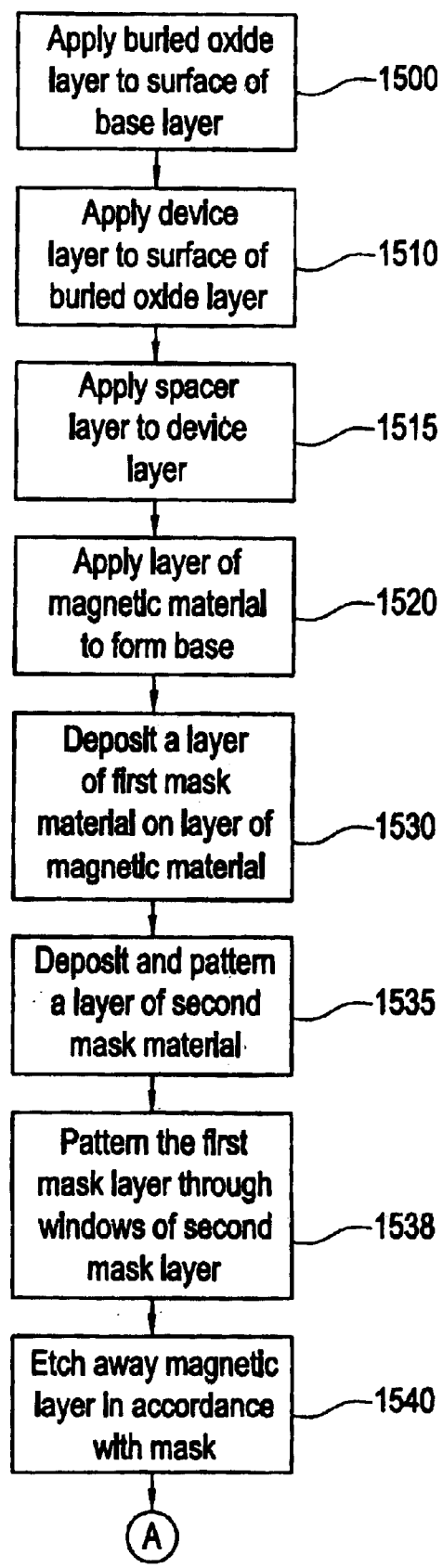
FIGS. 17A–E are flowcharts illustrating an exemplary method of fabricating the MEMS devices disclosed herein.
Figure 17B:
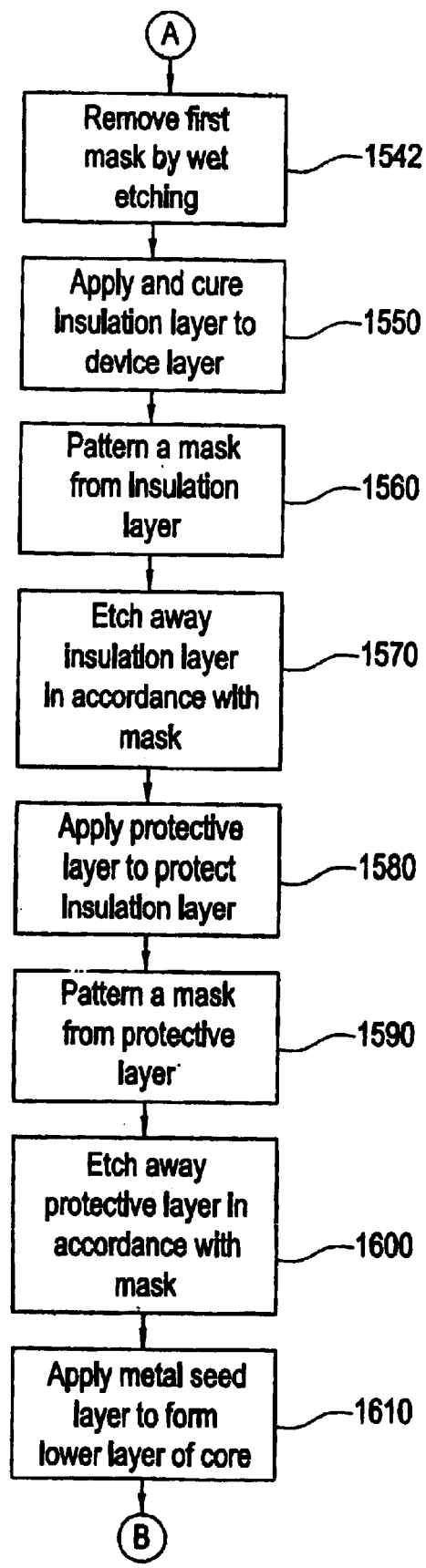
Figure 17C:
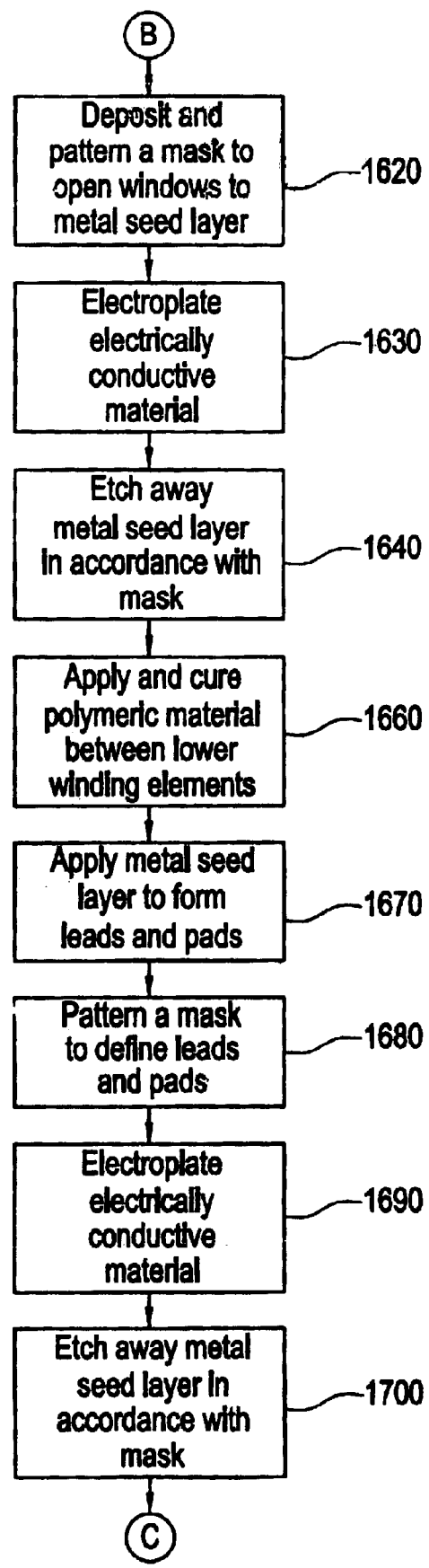
Figure 17D:
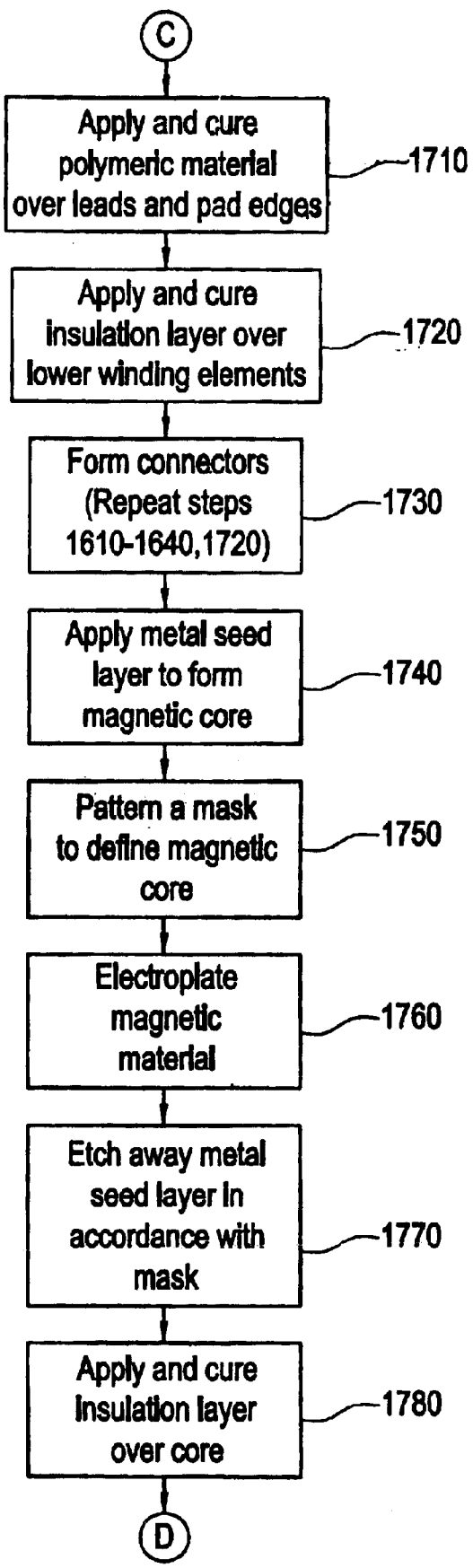
Figure 17E:
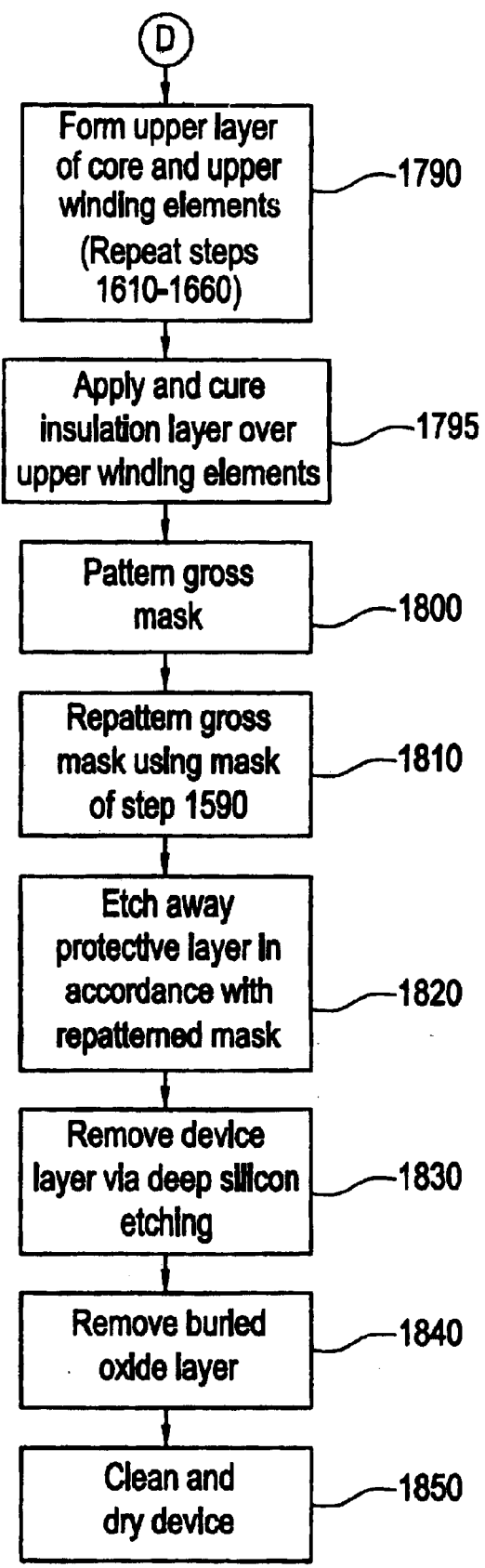

An exemplary embodiment of the MEMS device disclosed herein incorporated into a fluid pump is shown in FIG. 16B. The MEMS device 1210 includes a MEMS actuator 1212 and an actuable element 1214. The MEMS actuator 1212 may include a gap 1208 through which the actuable element 1214 can be displaced. The actuable element 1214 includes a base 1220 and an arm 1222 coupled to the base 1220. The actuable element 1214 may be disposed over a cavity 1216 in the substrate. The MEMS device 1210 includes a pump 1243 coupled to a source of fluid (not shown). The pump 1243 includes an outlet 1241, an inlet 1245, and a pump element 1242 coupled to the arm 1222 of the actuable element 1214. The MEMS device 1210 and its constituent parts are disposed on a substrate having a substantially planar surface. The MEMS device 1210 also includes a suitable control mechanism (not shown) for controlling the location of the actuable element 1214 in a direction substantially perpendicular to the substantially planar surface of the substrate. This control mechanism may be a clamp, a cantilever, a spring, or a suspension system, as previously provided herein.

Operation of the MEMS device 1210 is based on principles previously provided herein. In this embodiment, the actuable element 1214 comprises a piston that may be displaced along a path 1206 pumping fluid from the inlet 1245 to the outlet 1241. In FIG. 16B, the pump 1243 pushes fluid disposed between the pump element 1242 and the outlet 1241 toward the outlet 1241. By selectively applying an operating current to the actuator 1212, the actuable element 1214 and the pump element 1242 can be selectively displaced along the path 1206 to permit the pump 1243 to intake fluid through the inlet 1245 and push that fluid to the outlet 1241. In this manner, the MEMS device can function as a fluid pump.

Various other configurations of the MEMS device 1210 are possible. For example, the pump 1243 may be constructed in any manner known to one of ordinary skill in the art for constructing a pump that provides controlled fluid flow.

As shown in FIG. 16B, each of the MEMS actuator 1212, the actuable element 1214, and the pump 1243 lies in a plane that is substantially parallel to the substantially planar surface of the substrate. Alternately, any combination of the MEMS actuator 1212, the actuable element 1214, and the pump 1243 may lie in a plane that is inclined at an angle to the substantially planar surface of the substrate. Also alternately, any combination of the MEMS actuator 1212, the actuable element 1214, and the pump 1243 may include constituent portions that are not coplanar with each other.

The MEMS devices disclosed herein can be constructed from conventional micromachining processes known to one of ordinary skill in the art including, but not limited to, electroplating, etching, photolithography, sputtering, and vacuum deposition. Advantageously, the MEMS devices disclosed can be fabricated in batches. An exemplary method of constructing the MEMS device 10 shown in FIGS. 1A, 1B, and 1C, including the MEMS electromagnetic actuator 12 shown in FIGS. 2A, 2B, 2C, and 2D is provided in FIGS. 17A–E. This exemplary method may also be modified in a manner familiar to one of ordinary skill in the art to fabricate a batch of MEMS devices 10 from a single wafer.

The component parts of MEMS device 10 are micromachined in successive layers upon the substrate 54. The substrate 54 includes a base layer 54a and a buried oxide layer 54b formed thereon. Preferably, the base layer 54a is an Si wafer. Initially, a buried oxide layer 54b is applied to the surface of the base layer 54a, step 1500. Preferably, the buried oxide layer 54b is a layer of thermal oxide, for example, $SiO_2$. Next, a device layer 52 is applied to the surface of the buried oxide layer 54b, step 1510. Preferably, the device layer 52 is single crystal Si having a crystal orientation perpendicular to the plane of the insulating substrate 54 sufficient to fabricate a cantilever 24 having a desired elasticity, as previously indicated herein. Alternately, a single MEMS device 10 or a batch of MEMS devices 10 may be fabricated from a commercially available, prefabricated, composite silicon-on-insulator (SOI) wafer or a batch of SOI wafers, respectively.

The components of the MEMS device 10 may be fabricated at least partially from the material of the device layer 52. For example, as explained in greater detail below, the actuable element 14 includes an arm 22 that may be formed at least partially or entirely from the material of the device layer 52 and a base 20 that includes at least a portion 70 comprising magnetic material. Additionally, other components of the MEMS device 10 may be fabricated at least partially or entirely from the material of the device layer 52. For example, as explained in greater detail below, the cantilever 24 may be formed entirely from the device layer 52. Since the components of the MEMS device 10 may be fabricated at least partially from the material of the device layer 54, the MEMS device 10 has a compact size in a direction substantially perpendicular to the substantially planar surface of the substrate 54. The MEMS actuator 12 has an extent in a direction substantially perpendicular to the substantially planar surface of the device layer 52 of less than approximately 100 $\mu$m, and preferably less than approximately 50 $\mu$m. Additionally, the base 20 of the actuable element 12, specifically, the magnetic portion 70 of the base 20 and any optional spacer layer 20a (described below), has an extent in a direction substantially perpendicular to the substantially planar surface of the device layer 52 of less than approximately 10 $\mu$m, and preferably less than approximately 4 $\mu$m.

After step 1510, a layer of magnetic material is applied to the device layer 52 to form the base 20 of the actuable element 14, step 1520. The layer of magnetic material may include multiple alternating layers of chrome and a permanent magnetic material, for example, CoPt. In this embodiment, alternating layers of chrome may be applied to induce the desired epitaxial orientation. The multiple alternating layers may be applied by sputtering or vacuum deposition. Alternately, the layer of magnetic material may include alternating layers of chrome and a soft magnetic material, for example, NiFe. In this embodiment, alternating layers of chrome may be applied to facilitate adhesion of the soft magnetic material. Optionally, before applying the layer of magnetic material, a spacer layer 20a may be applied to the device layer 52 to adjust the location of the base 20 in the z-direction (i.e. in a direction perpendicular to the surface of the substrate) and separate the base 20 from the device layer 52, step 1515. The spacer layer 20a may include a layer of any material that will not be affected by subsequent fabrication processes. For example, the spacer layer 20a may include a layer of a polymeric material, a layer of a metallic material, and/or a layer of non-magnetic material. Preferably, the spacer layer 20a is constructed from a non-oxide material that is different from the materials out of which the masks described below are constructed.

Fabricating the magnetic portion 70 of base 20 from a permanent magnetic material continues by depositing a layer of a first mask material on the layer of magnetic material to define the base 20 of the actuable element 14, step 1530. As provided previously herein, the magnetic portion 70 need not have the same footprint as the base 20. The first mask material may include a layer of material resistant to high-powered non-reactive ion beam etching. For example, the first mask material may include a layer of aluminum oxide or silica. A layer of a second mask material is then deposited and patterned to form windows through the second mask layer to the first mask layer, step 1535. Depositing and patterning the second mask may include applying a layer of photoresist on the first mask material, soft baking the layer of photoresist, patterning a mask defining the base 20, exposing the layer of photoresist through the mask, and developing the layer of photoresist to remove areas exposed by ultraviolet light and open windows in the photoresist layer to the first mask layer. Next, the first mask layer is patterned through the windows of the second mask layer to form windows through the first mask layer to the layer of magnetic material, step 1538. Patterning the first mask layer may include reactive ion beam etching the first mask layer. Then, the layer of photoresist may be stripped, and the magnetic layer may be patterned through the windows in the first mask layer to define the base 20 of the actuable element 14, step 1540. In step 1540, all of the magnetic layer may be etched away except that portion of the magnetic layer defining the magnetic portion 70 of the base 20 of the actuable element 14. Etching away the magnetic layer may include high-powered non-reactive ion beam etching the magnetic layer in accordance with the first mask. The first mask may then be removed by wet etching, step 1542. Wet etching may include chemically etching away the first mask using a concentrated acid.

In fabricating the magnetic portion 70 of the base 20, depositing a first mask of material resistant to high-powered non-reactive ion beam etching may not be necessary, depending on whether high-powered non-reactive ion-beam etching is used to pattern the magnetic material. For example, fabricating the base 20 from a soft magnetic material may continue by following a method similar to that above, except that the first mask of material resistant to high-powered non-reactive ion beam etching may not need to be applied.

After step 1540, an insulation layer is applied to the device layer 52 and cured, step 1550. The insulation layer defines the location of the cavity 16 in the substrate 54, within which the actuable element 14 and the cantilever 24 may be suspended. The insulation layer may include a layer of aluminum oxide or silica applied by sputtering or vacuum deposition. A mask is then patterned from the insulation layer to define the cavity 16, the location of the arm 22, and the location of the cantilever 24, step 1560. The insulation layer is then etched away in accordance with the mask to define the cavity 16, the location of the arm 22, and the location of the cantilever 24, step 1570.

Next, a protective layer may be applied to protect the insulation layer, step 1580. The protective layer may include any material than can be selectively etched without affecting the structures fabricated from or built upon the device layer 52. For example, the protective layer may be a layer of metal, such as TiW, applied by sputtering or vacuum deposition. The protective layer may also be a layer of silicon nitride or a layer of a polymeric material. Preferably, the protective layer is not an oxide layer.

A mask is then patterned from the protective layer to protect the cavity 16, the location of the arm 22, and the location of the cantilever 24, step 1590. The protective layer is then etched away in accordance with the mask to protect the cavity 16, including the location of the arm 22, and the location of the cantilever 24, step 1600.

As suggested in FIGS. 2A, 2B, and 2C, the MEMS actuator 12 may be fabricated from the following process. A lower layer of electrically conductive material may be applied to the insulating substrate 54. The lower layer may then be etched to form a set of lower winding elements 32b in coil 32. Next, connectors 32c, 32d may be formed over the set of lower winding elements 32b. (Optionally, a magnetic core 30 may then be formed over the set of lower winding elements 32b and between the connectors 32c, 32d.) An upper layer of electrically conductive material may then be applied over the connectors 32c, 32d (and, optionally, the magnetic core 30). The upper layer of electrically conductive material may then be etched to form a set of the upper winding elements 32a in coil 32. The upper layer of electrically conductive material may be etched so that the upper winding elements 32a are connected to the lower winding elements 32b via connectors 32c, 32d to form the coil 32. Fabrication of the MEMS actuator 12 in this way permits compact packing of the coil 32 around the core 30. For example, in the preferred embodiment, the coil 32 continuously covers approximately 80% of the surface area of the core 30.

More specifically, after step 1600, a metal seed layer is applied to the device layer 52 to form a lower layer of electrically conductive material in the coil 32, step 1610. The metal seed layer may include multiple alternating layers of chrome and an electrically conductive material. Preferably, the electrically conductive material is copper or a copper alloy. Alternately, the electrically conductive material may include, but is not limited to, aluminum, gold, silver, and alloys thereof. A mask defining the winding elements of the lower set of winding elements 32b is then deposited and patterned to open windows to the metal seed layer, step 1620. Depositing and patterning the mask may include applying a layer of photoresist on the layer of electrically conductive material, soft baking the layer of photoresist, patterning a mask defining the winding elements of the lower set of winding elements 32b, exposing the layer of photoresist through the mask, and developing the layer of photoresist to remove areas exposed by ultraviolet light and open windows in the photoresist layer to the metal seed layer. An electrically conductive material, preferably copper or a copper alloy, and alternately gold, silver, and alloys thereof, is then electroplated onto the metal seed layer in the windows defined by the photoresist layer to form the winding elements of the lower set of winding elements, step 1630. The layer of photoresist is then stripped, and the metal seed layer is removed, step 1640. Removing the metal seed layer may include etching away the metal seed layer in accordance with the mask to facilitate electrical isolation of the winding elements of the lower set of winding elements 32b. Optionally, a polymeric material may be applied between the lower winding elements 32b and cured to electrically isolate the lower winding elements 32b from each other, step 1660. The polymeric material may be any non-conductive polymer or other non-magnetic material. The polymeric material may also be a cross-linked polymer, for example, baked photoresist, polyimide, and BCB (known by the tradename "Cyclotene").

Preferably, fabrication of the leads 18, 19 and the electrode pads 44, 46 follows fabrication of the lower winding elements 32b. After step 1660, a metal seed layer is applied to the device layer 52, step 1670. The metal seed layer may include multiple alternating layers of chrome and an electrically conductive material. Preferably, the electrically conductive material is gold or a gold alloy. Alternately, the electrically conductive material may include, but is not limited to, copper, silver, and alloys thereof. A mask is then patterned to define the leads 18, 19 and the electrode pads 44, 46, step 1680. An electrically conductive material, preferably gold or a gold alloy, and alternately copper, silver, and alloys thereof, is then electroplated onto the metal seed layer, step 1690. The metal seed layer is then etched away in accordance with the mask to define the electrode pads 44, 46 and the leads 18, 19, step 1700. Optionally, a polymeric material may be applied and cured over the leads 18, 19 and the edges of the electrode pads 44, 46 to protect them from contamination during the remainder of the fabrication process, step 1710. The polymeric material may be the polymeric material identified in step 1660.

After step 1710, an insulation layer is applied and cured over the lower winding elements 32b to insulate the lower winding elements 32b from the magnetic core 30, step 1720. The insulation layer may include a layer of the polymeric material mentioned in step 1660.

The connectors 32c, 32d may be constructed by following a technique analogous to that outlined in steps 1610–1640 and 1720 for forming and insulating the set of lower windings, step 1730.

The magnetic core 30 may be constructed by following a technique analogous to that outlined in steps 1610–1640 for forming the set of lower windings. After step 1730, a metal seed layer is applied to form the magnetic core, step 1740. The metal seed layer may include alternating layers of chrome and a magnetic material. In this embodiment, alternating layers of chrome may be applied to facilitate adhesion of the magnetic material. Preferably, the magnetic material is NiFe (permalloy). The magnetic material may, however, be selected from any soft magnetic material, including, but not limited to, CoFe (permendur), CoZr, FeN, AlSiFe (sendust) and alloys thereof, such as NiFeMo (supermalloy), NiFeCuCr (mumetal), NiFeCo, CoFeB, CoFeV (supermendur), CoFeCr (hiperco), CoZrTa, FeAlN, and FeTaN. A mask is then patterned to define the magnetic core, step 1750. A magnetic material, preferably NiFe, is then electroplated onto the metal seed layer in accordance with the mask, step 1760. The metal seed layer is then etched away in accordance with the mask to define the magnetic core 30, step 1770. Optionally, an insulation layer may be applied over the magnetic core 30 and cured to insulate the magnetic core 30 from the upper layer of electrically conductive material in the coil 32, step 1780. The insulation layer may include a layer of the polymeric material mentioned in step 1660.

The upper layer of electrically conductive material in the coil 32 and the upper winding elements 32a may be constructed by following a technique analogous to that outlined in steps 1610–1660 for forming the lower layer of electrically conductive material in the coil 32 and the lower winding elements 32b, step 1790. Additionally, an insulation layer may be applied and cured over the upper winding elements 32a, step 1795. The insulation layer may include a layer of the polymeric material mentioned in step 1660.

After step 1795, a gross mask is patterned, step 1800. Next, the gross mask is repatterned using the mask of step 1590, step 1810. The protective layer is then etched away in accordance with the repatterned gross mask to reveal the arm 22, the cantilever 24, and the location of the cavity 16, step 1820. Subsequently, the device layer 52 is removed by utilizing deep Si etching, step 1830. A chemical dry etch based on the conventional Bosch process may also be used to remove the device layer 52. Thereafter, the cavity 16 is formed by removing the buried oxide layer 54b, step 1840. The buried oxide layer 54b may be removed by first removing the repatterned gross mask and then utilizing a release etch or other conventional process, for example, a wet chemical etch or a dry etch. Cleaning and drying the MEMS device 10 completes processing, step 1850. Preferably, cleaning and drying is performed with supercritical carbon dioxide. Alternately, cleaning and drying may be performed with any other solvent known to one of ordinary skill in the art to be suitable for cleaning and drying a MEMS device.

In a batch fabrication process, the MEMS devices 10 may be singulated, e.g. die cut, after removing the device layer 52. Alternatively, the MEMS devices 10 may be singulated after removing the buried oxide layer, or after cleaning and drying, While the MEMS devices disclosed herein have been particularly shown and described with reference to the exemplary embodiments thereof, those of ordinary skill in the art will understand that various changes may be made in the form and details herein without departing from the spirit and scope of the disclosure. Those of ordinary skill in the art will recognize or be able to ascertain many equivalents to the exemplary embodiments described specifically herein by using no more than routine experimentation. Such equivalents are intended to be encompassed by the scope of the present disclosure and the appended claims.

We claim:

1. A MEMS device, the MEMS device comprising:

a substrate having a surface, an actuable element at least partially formed from the substrate, and an electromagnetic MEMS actuator disposed on the substrate for selectively applying a first force to the actuable element to displace the actuable element along a path.

2. The MEMS device of claim 1, wherein the actuable element has a base and an arm coupled thereto, the base of the actuable element including a portion comprised of a magnetic material.

3. The MEMS device of claim 2, wherein the magnetic material is comprised of at least one of a permanent magnetic material and a soft magnetic material.

4. The MEMS device of claim 2, wherein the magnetic material is comprised of at least one of ferrites, remalloy, vicalloy, AlNiCo, Co, CoPt, a rare earth metal, NiFe (permalloy), CoFe (permendur), CoZr, FeN, AlSiFe (sendust), NiFeMo (supermalloy), NiFeCuCr (mumetal), NiFeCo, CoFeB, CoFeV (supernendur), CoFeCr (hiperco), CoZrTa, FeAlN, FeTaN, and combinations thereof.

5. The MBMS device of claim 2, wherein the portion of the base comprised of a magnetic material has a length in a direction substantially parallel to the path and a cross-section having a first extent, the first extent of the cross-section varying over the length.

6. The MEMS device of claim 2, wherein the portion of the base comprised of a magnetic material has a length in a direction substantially parallel to the path and a cross-section having a first extent, the first extent of the cross-section being substantially constant over the length.

7. The MEMS device of claim 6, wherein the electromagnetic MEMS actuator comprises an electrically conductive coil.

8. The MEMS device of claim 7, wherein the path of the actuable element passes through a gap in the coil.

9. The MEMS device of claim 7, wherein the coil is comprised of a conductive material having a resistivity less than approximately $1 \times 10^{-7}$ $\Omega$m at 20° C.

10. The MEMS device of claim 7, wherein the coil is comprised of at least one of copper, aluminum, gold, silver, and alloys thereof.

11. The MEMS device of claim 7, wherein the coil has an inductance of at least approximately 50 nH.

12. The MEMS device of claim 7, wherein the coil has a circumference and a cross-section having a first extent, the first extent of the cross-section being substantially constant over the circumference.

13. The MEMS device of claim 7, wherein the coil has a circumference and a cross-section having a first extent, the first extent of the cross-section varying over the circumference.

14. The MEMS device of claim 7, wherein the electromagnetic MEMS actuator further comprises a magnetic core about which the electrically conductive core is wound.

15. The MEMS device of claim 14, wherein the core has a magnetic permeability of at least approximately $4 \times 10^3$.

16. The MEMS device of claim 14, wherein the core is comprised of a soft magnetic material.

17. The MEMS device of claim 16, wherein the soft magnetic material includes at least one of NiFe (permalloy), CoFe (permendur), CoZr, FeN, AlSiFe (sendust), NiFeMo (supermalloy), NiFeCuCr (mumetal), NiFeCo, CoFeB, CoFeV (supermendur), CoFeCr (hiperco), CoZrTa, FeAlN, FeTaN, and combinations thereof.

18. The MEMS device of claim 14, wherein the core has a circumference and a cross-section having a first extent, the first extant of the cross-section being substantially constant over the circumference.

19. The MEMS device of claim 14, wherein the core has a circumference and a cross-section having a first extent, the first extent of the cross-section varying over the circumference.

20. The MEMS device of claim 14, wherein the core has a first core end and a second core end, the first core end and the second core end being separated by a core gap, the path of the actuable element extending at least partially into the core gap.

21. The MEMS device of claim 20, wherein the core gap has an extent in a direction substantially perpendicular to the path of at least approximately 5 $\mu$m.

22. The MEMS device of claim 20, wherein the coil has a first coil end and a second coil end, the first coil end and the second coil end being separated by a coil gap, the coil gap having an extent equal to or greater than an extent of the core gap.

23. The MEMS device of claim 14, wherein the coil continuously covers at least approximately 80% of the surface area of the core.

24. The MEMS device of claim 14, wherein the coil includes at least ten windings about the core.

25. The MEMS device of claim 1, wherein the path extends substantially parallel to the substantially planar surface of the substrate.

26. The MEMS device of claim 1, further comprising a clamp for selectively clamping the actuable element at a desired position on the path.

27. The MEMS device of claim 26, wherein the clamp is coupled to at least one of the MEMS actuator and the actuable element.

28. The MEMS device of claim 1, further comprising a stop for selectively inhibiting displacement of the actuable element beyond a desired position on the path.

29. The MEMS device of claim 28, wherein the stop is coupled to the substrate.

30. The MEMS device of claim 28, wherein the stop comprises a wall disposed an the substrate, the wall protruding at least partially into the path.

31. The MEMS device of claim 1, further comprising a control mechanism operable to selectively apply a second force to the actuable element in a direction opposite to the first force.

32. The MEMS device of claim 31, wherein the control mechanism is formed from the substrate.

33. The MEMS device of claim 32, wherein the control mechanism is coupled to the actuable element at one end and the substrate at another end.

34. The MEMS device of claim 31, wherein the control mechanism comprises at least one cantilever.

35. The MEMS device of claim 34, wherein the at least one cantilever extends substantially parallel to the surface of the substrate.

36. The MEMS device of claim 34, wherein the control mechanism comprises a plurality of cantilevers.

37. The MEMS device of claim 36, wherein the actuable element has a first side, and the plurality of cantilevers are coupled to the first side.

38. The MEMS devise of claim 36, wherein the actuable element has a first side and a second side disposed opposite to the first side and at least one cantilever is coupled to the first side and at least one cantilever is coupled to the second side.

39. The MEMS device of claim 38, wherein at least one cantilever coupled to the first side of the actuable element is substantially coaxial with at least one cantilever coupled to the second side of the actuable element.

40. The MEMS device of claim 31, wherein the control mechanism comprises at least one spring coupled to the actuable element at one end and the substrate at another end.

41. The MEMS device of claim 31, wherein the control mechanism comprises a plurality of springs, each spring coupled at one end to the actuable element and at another end to the substrate.

42. The MEMS device of claim 31, wherein the control mechanism comprises a second MEMS actuator.

43. The MEMS device of claim 42, wherein the second MEMS actuator is a second electromagnetic MEMS actuator.

44. The MEMS device of claim 43, wherein the second electromagnetic MEMS actuator includes a magnetic core end an electrically conductive coil wound about the core.

45. The MEMS device of claim 1, wherein the MEMS device has an extent in a direction substantially perpendicular to the surface of the substrate of less than approximately 50 $\mu$m.

46. The MEMS device of claim 1, further comprising a suspension mechanism for selectively controlling the location of the actuable element in a direction substantially perpendicular to the surface of the substrate.

47. The MEMS device of claim 46, wherein the suspension mechanism comprises at least one alone or more clamps, one or more springs, or one or more cantilevers.

48. The MEMS device of claim 46, wherein the suspension mechanism comprises one or more permanent magnets.

49. The MEMS device of claim 46, wherein the suspension mechanism comprises one or more electromagnets.

50. A MEMS device comprising:
a substrate,
an actuable element,
a MEMS actuator disposed on the substrate for selectively applying a first force to the actuable element to displace the actuable element along a path, and
at least one cantilever coupled to the actuable element at one end and the substrate at another end to control displacement of the actuable element along the path.

51. The MEMS device of claim 50, wherein the MEMS actuator is disposed on the surface of the substrate.

52. The MEMS device of claim 50, wherein the actuable element includes an optical element for attenuating an optical beam lying in the path.

53. The MEMS device of claim 52, wherein the optical beam comprises at least one of a light beam and a particle beam.

54. The MEMS device of claim 52, wherein the optical beam lies in a plane substantially parallel to the surface of the substrate.

55. The MEMS device of claim 54, wherein the optical beam lies in a plane substantially perpendicular to the surface of the substrate.

56. The MEMS device of claim 50, wherein the optical element is a shutter for selectively blocking the optical beam.

57. The MEMS device of claim 56, wherein the shutter includes at least one of an opaque, a semi-transparent, a semi-reflective, and a reflective surface.

58. The MEMS device of claim 50, wherein the at least one cantilever extends substantially parallel to the surface of the substrate.

59. The MEMS device of claim 50, wherein the actuable element has a first side, and a plurality of cantilevers are coupled to the first side.

60. The MEMS device of claim 50, wherein the actuable element has a first side and a second side disposed opposite to the first side, and at least one cantilever is coupled to the first side and at least one cantilever is coupled to the second side.

61. The MEMS device of claim 60, wherein at least one cantilever coupled to the first side is substantially coaxial with at least one cantilever coupled to the second side.

62. The MEMS device of claim 50, wherein at least a portion of the actuable element is formed from the substrate.

63. The MEMS device of claim 50, wherein at least a portion of the cantilever is formed from the substrate.

64. A MEMS device comprising:

a substrate, first and second actuable elements, a first MEMS actuator for selectively applying a first force to the first actuable element to displace the first actuable element along a first path, a second MEMS actuator for selectively applying a second force to the second actuable element to displace the second actuable element along a second path, a first cantilever coupled to the first actuable element for controlling the displacement of the first actuable element along the first path, and a second cantilever coupled to the second actuable element for controlling the displacement of the second actuable element along the second path.

65. The MEMS device of claim 64, further comprising a first optical element coupled to the first actuable element and a second optical element coupled to the second actuable element.

66. The MEMS device of claim 65, wherein the first path and the second path are positioned to intersect an optical beam.

67. The MEMS device of claim 66, wherein the first optical element and the second optical element may each be selectively displaced along the first and second path, respectively, to selectively attenuate the optical beam.

68. A MEMS device disposed on a substrate having at least a top layer, the MEMS device comprising:

an actuable element comprising a base and a generally elongated arm extending from the base, the base including a magnetic material, at least a portion of the actuable element being formed from the top layer of the substrate, and an electromagnetic MEMS actuator comprising an electrically conductive coil arranged to generate a magnetic field within a gap formed by spaced apart ends of the coil upon application of a current to the coil, the base of the actuable element being positioned proximate the gap such that the actuable element can be displaced relative to the gap upon application of the magnetic field on the magnetic material.

69. A MEMS device disposed on a substrate, the MEMS device comprising:

an actuable element comprising a base and a generally elongated arm extending from the base, the base including a magnetic material, an electromagnetic MEMS actuator comprising an electrically conductive coil arranged to generate a magnetic field within a gap formed by spaced apart ends of the coil upon application of a current to the coil, the base of the actuable element being positioned proximate the gap such that the actuable element can be displaced relative to the gap upon application of the magnetic field on the magnetic material, end a cantilever attached to the substrate at one end and the arm of the actuable element at another end.

* * * * *